(12) United States Patent
Kashyap et al.

(10) Patent No.: US 12,305,279 B2
(45) Date of Patent: May 20, 2025

(54) ULTRA HIGH-K HAFNIUM OXIDE AND HAFNIUM ZIRCONIUM OXIDE FILMS

(71) Applicants: APPLIED MATERIALS, INC., Santa Clara, CA (US); The Regents of the University of California, Oakland, CA (US)

(72) Inventors: Harshil Kashyap, San Diego, CA (US); Andrew C. Kummel, San Diego, CA (US); Ajay Kumar Yadav, Santa Clara, CA (US); Keith T. Wong, Mountain View, CA (US); Srinivas Nemani, Saratoga, CA (US); Ellie Yieh, San Jose, CA (US)

(73) Assignees: Applied Materials, Inc., Santa Clara, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 18/119,432

(22) Filed: Mar. 9, 2023

(65) Prior Publication Data

US 2024/0301552 A1    Sep. 12, 2024

(51) Int. Cl.
| | |
|---|---|
| C23C 16/455 | (2006.01) |
| C23C 16/24 | (2006.01) |
| C23C 16/40 | (2006.01) |

(52) U.S. Cl.
CPC ........ C23C 16/45529 (2013.01); C23C 16/24 (2013.01); C23C 16/40 (2013.01); C23C 16/45546 (2013.01); C23C 16/45553 (2013.01)

(58) Field of Classification Search
CPC ... C23C 16/45529; C23C 16/24; C23C 16/40; C23C 16/45546; C23C 16/45553
See application file for complete search history.

(56) References Cited

U.S. PATENT DOCUMENTS

| | | | |
|---|---|---|---|
| 2004/0043149 A1* | 3/2004 | Gordon | C01G 27/02 427/255.394 |
| 2022/0059668 A1* | 2/2022 | Mokhtarzadeh | H01L 21/28088 |
| 2022/0254785 A1* | 8/2022 | Lai | H10B 12/315 |

OTHER PUBLICATIONS

Kühnel, et al., "High-density energy storage in Si-doped hafnium oxide thin films on area-enhanced substrates," Journal of Vacuum Science & Technology B 37, 021401 (2019). https://doi.org/10.1116/1.5060738.
Mart, et al., "Frequency domain analysis of pyroelectric response in silicon-doped hafnium oxide (HfO2) thin films," Applied Physics Letters 113.12 (2018): 122901. https://doi.org/10.1063/1.5046844.
Mart, et al., "Layer thickness scaling and wake-up effect of pyroelectric response in Si-doped HfO2," Applied Physics Letters 112.5 (2018): 052905. https://doi.org/10.1063/1.5019308.

(Continued)

*Primary Examiner* — Michael G Miller
(74) *Attorney, Agent, or Firm* — Lowenstein Sandler LLP

(57) ABSTRACT

Described herein is a method for performing an atomic layer deposition process to form a silicon doped oxide film on a surface of the substrate. The oxide film may be a hafnium-zirconium oxide film, or a zirconium oxide film. The atomic layer deposition process may include forming the oxide layers and a silicon layer using a hydrogen peroxide as at least one of the precursors used in formation of the oxide layers.

17 Claims, 19 Drawing Sheets

(56) References Cited

OTHER PUBLICATIONS

Richter, et al., "Si Doped Hafnium Oxide—A "Fragile" Ferroelectric System," Adv. Electron. Mater. 2017, 3 (10), 1700131. https://doi.org/10.1002/aelm.201700131.

Böscke, et al., "Ferroelectricity in Hafnium Oxide Thin Films," Applied Physics Letters 99.10 (2011): 102903. https://doi.org/10.1063/1.3634052.

Park, et al., "Ferroelectricity and Antiferroelectricity of Doped Thin HfO2-Based Films," Advanced Materials 27.11 (2015): 1811-1831. https://doi.org/10.1002/adma.201404531.

Park, et al., "Morphotropic phase boundary of Hf1-x ZrxO2 thin films for dynamic random access memories," ACS Applied Materials & Interfaces 2018, 10(49), 42666-42673. https://doi.org/10.1021/acsami.8b15576.

Karbasian, et al., "Stabilization of ferroelectric phase in tungsten capped Hf0.8Zr0.2O2," Appl. Phys. Lett. 111, 022907 (2017). https://doi.org/10.1063/1.4993739.

Cheema, et al. "Ultrathin ferroic HfO2—ZrO2 superlattice gate stack for advanced transistors," Nature 604.7904 (2022): 65-71. https://doi.org/10.1038/s41586-022-04425-6.

Gong and Ma, "A Study of Endurance Issues in HfO2-Based Ferroelectric Field Effect Transistors: Charge Trapping and Trap Generation," IEEE Electron Device Lett. 2018, 39 (1), 15-18. https://doi.org/10.1109/LED.2017.2776263.

\* cited by examiner

ULTRA HIGH-K HAFNIUM OXIDE AND HAFNIUM ZIRCONIUM OXIDE FILMS

TECHNICAL FIELD

Embodiments of the present disclosure relate, in general, to a method for forming a silicon doped oxide film on a surface of a substrate, wherein the method includes forming the film using an atomic layer deposition process.

BACKGROUND

A high dielectric constant ("high-k") film can be useful to memory devices and front end logic. A high-k film refers to a film formed of a material having a high dielectric constant (k), where a high dielectric constant may be a dielectric constant of at least about 10, for example. It is also beneficial for materials used for memory devices (e.g., dynamic random access memory (DRAM)) and front end logic to have low leakage and high endurance. However, high-k films are significantly more prone to reliability issues than, for example, conventional silicon oxynitride films. For example, low bandgap material having high k tend to have electrical leakage while high-k ferroelectric (FE) and anti-ferroelectric (AFE) films are known to have poor endurance, making them less suitable for memory applications and memory devices. Currently, high-k materials used in logic devices are based on amorphous hafnium oxides ($HfO_2$), which has a k of about 20), while the high-k materials used in DRAM are based on amorphous or nanocrystalline zirconium oxide ($ZrO_2$), which has a k of about 25). In general, crystallinity increases the dielectric constant but also the leakage in these materials. The growth of both $HfO_2$ and $ZrO_2$ is based on thermal ALD using a metal chloride, $H_2O$, $O_3$ or $O_2$ plasma as precursors.

SUMMARY

In some embodiments of the present disclosure, a method of performing an atomic layer deposition process to form a silicon doped hafnium zirconium oxide film on a surface of a substrate is provided. The method may include performing an atomic layer deposition process including depositing at least one first layer including hafnium oxide by exposing the surface of the substrate to hydrogen peroxide ($H_2O_2$) and exposing the surface of the substrate to a hafnium-containing precursor. The atomic layer deposition process may further include depositing at least one second layer comprising zirconium oxide by exposing the surface of the substrate to $H_2O_2$ and exposing the surface of the substrate to a zirconium-containing precursor. The atomic layer deposition process may further include deposition at least one third layer including silicon by exposing the surface of the substrate to $H_2O_2$ and exposing the surface of the substrate to a silicon-containing precursor.

In another embodiment of the present disclosure, a method of performing an atomic layer deposition process to form a silicon doped zirconium oxide film on a surface of a substrate is provided. The method may include performing the atomic layer deposition process including depositing at least one first layer including a zirconium oxide by exposing the surface of the substrate to $H_2O_2$ and exposing the surface of the substrate to a zirconium-containing precursor. The method may further include depositing at least one second layer including silicon by exposing the surface of the substrate to $H_2O_2$ and exposing the surface of the substrate to a silicon-containing precursor.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
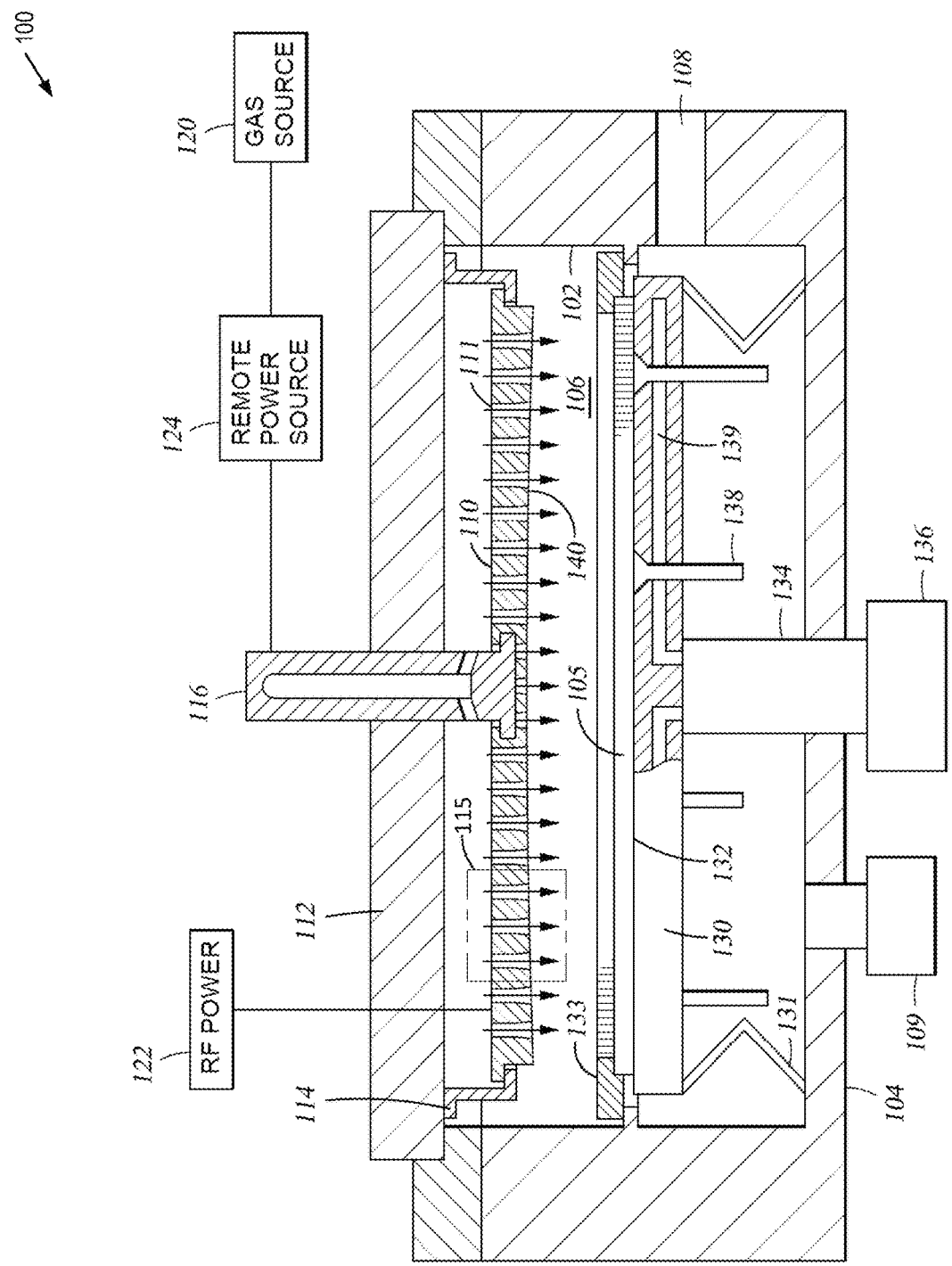
FIG. 1 is a cross-sectional view of an example deposition chamber system, according to some aspects of the present disclosure.

Embodiments disclosed herein describe high-k films of silicon doped hafnium zirconium oxide (Si doped $HfZrO_4$) and silicon doped zirconium oxide (Si doped $ZrO_2$) that have high reliability and low leakage. Conventional high-k oxides such as ferroelectric and antiferroelectric $HfO_2$ tend to suffer from low reliability and high leakage. This is a fundamental problem in ferroelectric and antiferroelectric films due to ferroelectric switching upon application of electric fields. Si doping of $HfZrO_4$ (Hf:Zr=about 1:1 but variable) is shown in embodiments to stabilize an antiferroelectric tetragonal phase and increase a coercive field without any change in the k value, reducing or eliminating ferroelectric and antiferroelectric switching. Without ferroelectric and antiferroelectric switching, the endurance of the film may be increased about four orders of magnitude. This makes Si doped HfZrO$_4$ films (also referred to simply as HZO films) a candidate for both DRAM and logic gate stack. Similar properties have been found for Si doped ZrO$_2$ films in embodiments.

Embodiments cover formation of Si doped HfZrO$_4$ films and Si doped ZrO$_2$ films formed by atomic layer deposition (ALD). Incorporation of Si during the atomic layer deposition (ALD) process is challenging. Conventionally, Si incorporation is enabled by ozone or plasma enhanced ALD (PE-ALD) since neither O$_2$ nor H$_2$O are sufficiently reactive for form the film. This is problematic since both ozone and PE-ALD are known to oxidize the substrate and grow thick interlayers. This increases the effective oxide thickness (EOT), which causes the film to have a lower dielectric constant, a higher leakage and/or a lower reliability. Embodiments described herein allows doping of HZO by Si without substrate oxidation and maintains low leakage in the HZO film.

The Si doped HfZrO$_4$ films and Si doped ZrO$_2$ films formed by atomic layer deposition (ALD) using H$_2$O$_2$ as an oxygen source as described in embodiments herein lack ferroelectric switching, which results in better endurance performance as compared to known high-k films. Formation of high-k tetragonal phase without switching may be achieved for these Si doped HfZrO$_4$ films and Si doped ZrO$_2$ films in embodiments.

According to embodiments of the present disclosure, silicon-doping using hydrogen peroxide (H$_2$O$_2$) is shown to allow control over the AFE switching in films. That is, silicon-doping with H$_2$O$_2$ was found to create a "pinned" AFE state which provides a much higher endurance as compared to standard FE and AFE films. For example standard FE and AFE films in contrast were shown to have high switching and poorer endurance, and failed after about $10^5$ cycles of use. In contrast to standard FE and AFE films, the silicon-doped "pinned" AFE film of the present disclosure was able to endure $10^{10}$ cycles of use prior to failure. Further, the method of the present disclosure is able to achieve a dielectric constant resulting in a capacitance of at least about 15 microfarad/cm$^2$ (mfd/cm$^2$). Therefore, embodiments of the present disclosure are suitable for memory applications, including a DRAM application. Embodiments are also suitable for front end logic.

Embodiments disclosed herein describe a method for performing an atomic layer deposition process to form a silicon doped hafnium zirconium oxide film or a silicon doped zirconium oxide film on a surface of a substrate. Performing the atomic layer deposition process may include depositing at least one first layer including hafnium oxide by exposing the surface of the substrate to H$_2$O$_2$ and exposing the surface of the substrate to a hafnium-containing precursor. The atomic layer deposition process may also include depositing at least one second layer including zirconium oxide by exposing the surface of the substrate to H$_2$O$_2$ and exposing the surface of the substrate to a zirconium-containing precursor. The atomic layer deposition process may further include depositing at least one third layer including silicon by exposing the surface of the substrate to H$_2$O$_2$ and exposing the surface of the substrate to a silicon-containing precursor.

By using H$_2$O$_2$ to dope the silicon in combination with either hafnium zirconium oxide or zirconium oxide, switching and/or hysteresis may be prevented so that the film remains in the AFE state. When the film remains in the AFE state, a device comprising the film has high endurance and high capacitance and/or dielectric constant when compared to current products on the market. In some embodiments, when a hafnium zirconium oxide is used, then the hafnium and zirconium is present at about a 1:1 ratio. In some embodiments, the amount of hafnium oxide present in the material is about 40 mol % to about 100 mol %, while the amount of zirconium oxide present in the material is about 40 mol % to about 60 mol %.

In some embodiments, the hafnium-containing precursor may include bis(cyclopentiadienyl)dimethylhafnium, bis(methylcyclopentadienyl)dimethylhafnium, bis(methylcyclopentadienyl)methoxymethylhafnium, hafnium(IV) t-butoxide, hafnium(IV) ethoxide, tetrakis(diethylamino)hafnium, tetrakis(ethylmethylamino)hafnium, tetrakis(2,2,6,6-tetramethyl-3,5-heptanedionato)hafnium(IV), HfCl$_4$, HfCp, or a combination thereof.

In some embodiments, the zirconium-containing precursor may include tetrakis(ethylmethylamido)zirconium, tetrakis(dimethylamido)zirconium, tetrakis(diethylamido)zirconium, zirconium (IV) tert-butoxide, zirconium (IV) bromide, ZrCl$_4$, or a combination thereof.

In some embodiments, the hafnium-containing precursor may include tetrakis(dimethylamino)hafnium and the zirconium-containing precursor may include tetrakis(dimethylamino)zirconium.

In some embodiments, the silicon-containing precursor may include silane, SiCl$_4$, tetrakis(dimethylamino)silicon, or a combination thereof.

In some embodiments, a method is provided to form a silicon doped zirconium oxide film on a surface of a substrate by an atomic layer deposition process. The atomic layer deposition process may be provided as described above, except that a hafnium oxide layer is not formed during the atomic layer deposition process.

As used herein, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon. Examples of substrates include wafers (e.g., patterned or unpatterned wafers such as Si wafers), displays, and so on.

A substrate as used herein may also refer to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, silicon germanium, and any other materials such as metals, metal nitrides, metal alloys, and other conductive materials, depending on the application. Substrates include, without limitation, semiconductor wafers, displays, and so on.

Substrates may be exposed to a pretreatment process to polish, etch, reduce, oxidize, hydroxylate (or otherwise generate or graft target chemical moieties to impart chemical functionality), anneal and/or bake the substrate surface. In addition to layer processing steps performed directly on the surface of the substrate itself, in the present disclosure, any of the layer processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what layers are to be deposited, as well as the particular chemistry used. In one or more embodiments, the first substrate surface may comprise a metal or metal oxide, and the second substrate surface may comprise a Si-containing dielectric, or vice versa. In some embodiments, a substrate surface may comprise certain functionality (e.g., —OH, —NH, etc.). In some embodiments, the substrate surface may include TiN, $SiO_2$, or W, which may be applied to the substrate such as through a sputtering process. In other embodiments, after the silicon-doped oxide layer is applied to the substrate surface, an additional metal film may be added through a deposition process such as a sputtering process. The additional metal film may include TiN, $SiO_2$, or W, or a combination thereof.

As used herein, the term "pinned AFE" or "pinned anti-ferroelectric" refers to a state in which the material maintains an paraelectric state and does not switch between a positive and negative voltage during various cycles over a given voltage range, such as +/−1V or +/−2V.

Referring now to the figures, FIG. 1 is a cross-sectional view of an example deposition chamber system 100, according to some aspects of the present disclosure. In this illustrative embodiment, the system 100 is an ALD system. However, the system 100 is just an exemplary system that may be used to deposit coating(s) on a substrate, and it is contemplated that other deposition chambers may be utilized in accordance with the embodiments described herein. In some embodiments, the system 100 can be used to deposit a hafnium zirconium oxide film, a silicon doped hafnium zirconium oxide film, a zirconium oxide film, or a silicon doped zirconium oxide film on a surface of a substrate. The film may be grown or deposited using ALD on various substrates including silicon-based substrates, carbon-based substrates, metal-based substrates, and/or dielectric substrates. In some examples, the substrate may be made up of one of $SiO_2$, Si, TiN, GaN, W, a dielectric material, or a carbon-based material, and so on.

The chamber system 100 generally includes walls 102, a bottom 104, and a gas distribution plate or diffuser 110, and substrate support 130 which define a process volume 206. The process volume 106 is accessed through a sealable slit valve 108 formed through the walls 102 such that the substrate may be transferred in and out of the chamber system 100. The substrate support 130 includes a substrate receiving surface 132 for supporting a substrate 105 and stem 134 coupled to a lift system 136 to raise and lower the substrate support 130. A reactor frame 133 (e.g., mask frame or shadow frame) may be placed over a periphery of the substrate 105 during processing. Lift pins 138 may be moveably disposed through the substrate support 130 to move the substrate 105 to and from the substrate receiving surface 132 to facilitate substrate transfer. The substrate support 130 may also include heating and/or cooling elements 139 to maintain the substrate support 130 and substrate 105 positioned thereon at a target temperature. The substrate support 130 may also include grounding straps 131 to provide RF grounding at the periphery of the substrate support 130.

The diffuser 110 may be coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 may be coupled to the backing plate 112 to provide gas through the backing plate 112 to a plurality of opening structures 111 corresponding to gas passages formed in the diffuser 110 and to the substrate receiving surface 132. A vacuum pump 109 may be coupled to the chamber system 100 to control the pressure within the process volume 106. An RF power source 122 may be coupled to the backing plate 112 and/or to the diffuser 110 to provide RF power to the diffuser 110 to generate an electric field between the diffuser 110 and the substrate support 130 so that a plasma may be formed from the gases present between the diffuser 110 and the substrate support 130. Various RF frequencies may be used, such as a frequency between about 0.3 MHz and about 200 MHz. In some embodiments, no plasma is formed during deposition.

Deposition chamber system 100 may pulse one or more precursor and/or reactant gases provided by gas source 120 to expose a substrate to the gases. After each pulse of a precursor and/or reactant gas, a remainder of the precursor/reactant gas may be exhausted from the chamber. A subsequent precursor/reactant gas may then be pumped into the chamber to expose the substrate to the subsequent precursor/reactant gas. This cycle may repeat until a target film is formed on a substrate.

Between processing substrates, a cleaning gas may be provided to the remote power source 124 and excited to form a remote plasma from which dissociated cleaning gas species may be generated and provided to clean chamber components. The cleaning gas may be further excited by the RF power source 122 provided to flow through the diffuser 110 to reduce recombination of the dissociated cleaning gas species. Suitable cleaning gases include but are not limited to $NF_3$, $F_2$, and $SF_6$.

In one embodiment, the heating and/or cooling elements 139 may be utilized to maintain the temperature of the substrate support 130 and substrate 105 thereon during deposition less than about 400 degrees Celsius. In one embodiment, the heating and/or cooling elements 139 may be used to control the substrate temperature to less than 350 degrees Celsius, such as between 250 degrees Celsius and about 350 degrees Celsius.

The spacing during deposition between a top surface of the substrate 105 disposed on the substrate receiving surface 132 and a bottom surface 140 of the diffuser 110 may be between 100 mil and about 1,200 mil, for example between 100 mil and about 500 mil, in some embodiments.

Figure 2A:
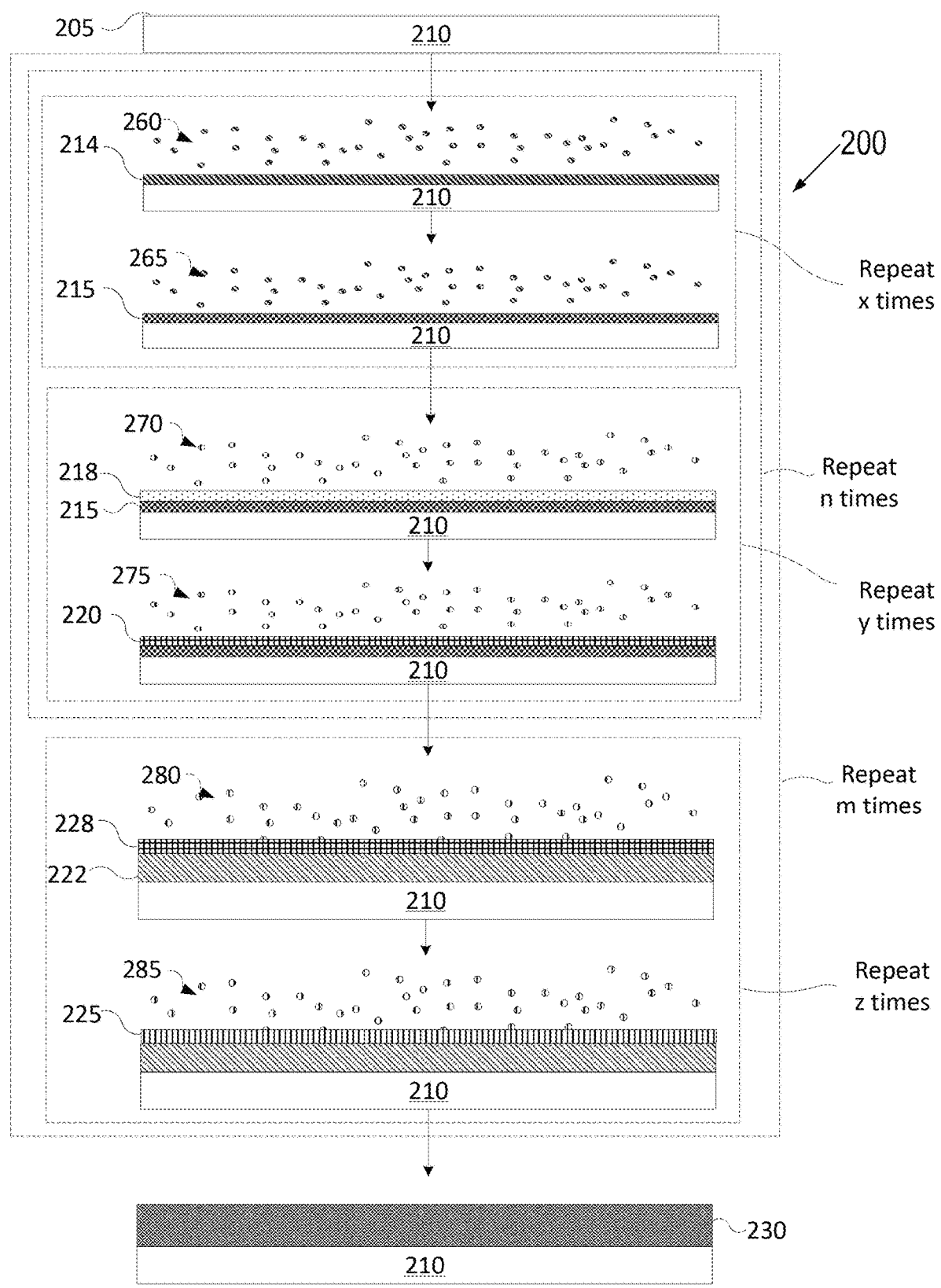
FIG. 2A depicts a hafnium-zirconium oxide deposition process in accordance with a variety of Atomic Layer Deposition techniques, according to some aspects of the present disclosure.

FIG. 2A depicts a hafnium-zirconium oxide deposition process in accordance with a variety of Atomic Layer Deposition techniques, according to some aspects of the present disclosure. ALD allows for a controlled self-limiting deposition of material through chemical reactions with the surface of the article. Aside from being a conformal process, ALD is also a uniform process. A typical reaction cycle of an ALD process starts with a precursor (i.e., a single chemical A) flooded into an ALD chamber and adsorbed onto the surface of the article. The excess precursor is then flushed out of the ALD chamber before a reactant (i.e., a single chemical R) is introduced into the ALD chamber and subsequently flushed out. ALD techniques produce relatively thin (e.g., 10 μm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM). The TEM may be performed using a 100 nm thick TEM lamella prepared by focused ion beam milling, with the TEM operated at 200 kV in bright-field, dark-field, and high-resolution mode. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

Referring to FIG. 2A, an article 210 has a surface 205. Article 210 may represent various substrates and/or substrate types including but not limited to semiconductor wafers, LEDs (e.g., micro LEDs), glass wafers, and so on. The article 210 and surface 205 may be made from a metal (such as aluminum, stainless steel, titanium, copper, etc.), a ceramic, a metal-ceramic composite, a polymer, a polymer ceramic composite, a carbon-based material, a dielectric material, or other suitable materials, and may further comprise materials such as AlN, Si, SiC, $Al_2O_3$, $SiO_2$, TiN, Ru, GaN, and so on.

ALD may be performed by alternately exposing the article to two or more precursors and/or reactants. Each individual chemical reaction between a precursor and the surface is known as a "half-reaction." During each half reaction, a precursor or reactant is pulsed onto the surface for a period of time sufficient to allow the precursor or reactant to fully react with the surface (e.g., adsorb onto the surface). The reaction is self-limiting as the precursor/reactant will only react with a finite number of available reactive sites on the surface, forming a uniform continuous adsorption layer on the surface. Any sites that have already reacted with a precursor/reactant will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

The surface reactions (e.g., half-reactions) are done sequentially. Prior to introduction of a new precursor, the chamber in which the ALD process takes place may be purged with an inert carrier gas (such as nitrogen or air) to remove any unreacted precursor and/or surface-precursor reaction byproducts. At least one precursor is used at a time. In some embodiments, more than one precursor may be used to grow film layers having the same composition (e.g., to grow multiple layers of hafnium-zirconium oxide on top of each other). For example, in some embodiments co-dosing may be performed by flowing a precursor for zirconium and a precursor for hafnium together rather than alternating between flowing of a hafnium precursor and a zirconium precursor. In some embodiments, different precursors may be used to grow different film layers having different compositions.

As illustrated in FIG. 2A, article 210 having surface 205 may be introduced to a first precursor 260 for a first duration until a first half reaction of the first precursor 260 with surface 205 partially forms layer 215 by forming an adsorption layer 214. Subsequently, article 210 may be introduced to a second precursor 265 (also referred to as a reactant) to cause a second half reaction to react with the adsorption layer 214 and fully form the layer 215. The first precursor 260 may be an oxygen precursor or organometallic precursor. In some examples, the first precursor 260 includes water or $H_2O_2$.

The second precursor 265 may be a hafnium-containing precursor. In some embodiments, the second precursor 265 may be bis(cyclopentiadienyl)dimethylhafnium, bis(methylcyclopentadienyl)dimethylhafnium, bis(methylcyclopentadienyl)methoxymethylhafnium, hafnium(IV) t-butoxide, hafnium(IV) ethoxide, tetrakis(diethylamino)hafnium, tetrakis(ethylmethylamino)hafnium, tetrakis(dimethylamino) hafnium, tetrakis(2,2,6,6-tetramethyl-3,5-heptanedionato) hafnium(IV), $HfCl_4$, HfCp, or a combination thereof. Layer 215 may be uniform, continuous, and conformal. The article 210 may alternately be exposed to the first precursor 260 and second precursor 265 up to x number of times to achieve a target thickness for the layer 215. X may be an integer from 1 to 100, for example. In some examples, X is approximately 5. In embodiments, layer 215 is a hafnium oxide layer.

The article 210 having surface 205 may then be introduced to a third precursor 270 for a duration until a first half reaction of the third precursor 270 with fully formed layer 215 partially forms layer 220 by forming an adsorption layer 218. Subsequently, article 210 may be introduced to a fourth precursor 275 (also referred to as a reactant) to cause a second half reaction to react with the adsorption layer 218 and fully form the layer 220. The third precursor 270 may be an oxygen containing precursor. In some examples, the third precursor 270 includes $H_2O_2$.

The fourth precursor 275 may be a zirconium-containing precursor. In some embodiments, the fourth precursor 275 may be tetrakis(ethylmethylamido)zirconium, tetrakis(dimethylamido)zirconium, tetrakis(diethylamido)zirconium, bis (cyclopentadienyl)dimethylzirconium, zirconium (IV) tert-butoxide, zirconium (IV) bromide, $ZrCl_4$, or a combination thereof. Layer 220 may be uniform, continuous, and conformal. In embodiments, layer 220 is a zirconium oxide layer.

The article 210 may alternately be exposed to the third precursor 270 and fourth precursor 275 up to y number of times to achieve a target thickness for the second layer 220. Y may be an integer from 1 to 100, for example. In some examples, Y is approximately 5.

In embodiments, the ALD process includes alternately forming the first layer 215 and the second layer 220 multiple times to form a film 222 of hafnium zirconium oxide (e.g., $HfZrO_4$). For example, a super-cycle may be performed n times, where the super-cycle includes alternately exposing the article 210 to the first and second precursors x times and then alternately exposing the article to the third and fourth precursors y times. In some embodiments, n is equal to 1, and the super-cycle is therefore performed a single time prior to exposing the film 222 to a silicon precursor. Alternatively, n may be an integer value greater than 1, such as a value from 2-100. Other values of n may also be used.

In some embodiments, the method to form the first and second layer 215, 220 may be performed such that the amount of hafnium oxide is about 45 mol % to about 60 mol % and the amount of zirconium oxide is about 55 mol % to about 100 mol %. In some embodiments, the ratio of hafnium to zirconium is about 1:1.

The article 210 having the film 222 comprising one or more of first and second layer(s) 215, 220 may then be introduced to a fifth precursor 280 for a duration until a first half reaction of the fifth precursor 280 with film 222 partially forms layer 225 by forming an adsorption layer 228. Subsequently, article 210 may be introduced to a sixth precursor 285 (also referred to as a reactant) to cause a second half reaction to react with the adsorption layer 228 and fully form the layer 225. The fifth precursor 280 may be an oxygen containing precursor. In some examples, the fifth precursor 270 includes ozone, or $H_2O_2$.

The sixth precursor 285 may be a silicon-containing precursor. In some embodiments, the silicon-containing precursor 285 may be silane, $SiCl_4$, tetrakis(dimethylamino) silicon or a combination thereof. Layer 225 may be uniform, continuous, and conformal. The article 210 may alternately be exposed to the fifth precursor 280 and sixth precursor 285 up to z number of times to achieve a target thickness for the layer 225. Z may be an integer from 1 to 100, for example. In some examples, Z is approximately 1. The amount of silicon present in the silicon doped hafnium-zirconium oxide film may affect the amount of ferroelectric and antiferroelectric switching of devices (e.g., memory devices) created using the silicon doped hafnium-zirconium oxide film upon application of electric fields. That is, if there is too much silicon present, the films may not crystallize into high-k phase and be amorphous with a lower-k. Alternatively, if not enough silicon is present, then ferroelectric and/or antiferroelectric switching occurs when the film is exposed to an electric field. Thus, the ratio of hafnium-zirconium oxide to silicon allows for the prevention of the switching.

In some embodiments, rather than flowing the silicon-containing precursor to deposit a Silicon containing layer after forming the hafnium oxide and/or zirconium oxide layers, a silicon-containing precursor may be flowed into the chamber at the same time as the zirconium-containing precursor and/or the hafnium-containing precursor. This technique is referred to herein as co-dosing. The ratio of the silicon-containing precursor to the hafnium and/or zirconium-containing precursors may be set such that there is a much smaller amount of silicon than hafnium or zirconium in the coating. In one embodiment, the ratio of the silicon-containing precursor to the hafnium and/or zirconium-containing precursors is 1:5 to 1:100. In another embodiment, the ratio of the silicon-containing precursor to the hafnium and/or zirconium-containing precursors is 1:5 to 1:30. In some embodiments, the silicon-containing precursor is not injected into the chamber every cycle in which the hafnium and/or zirconium-containing precursor is injected into the chamber. For example, three to eight cycles of flowing the third and fourth precursors into the chamber may be performed without flowing the silicon-containing precursor into the chamber, followed by a single cycle in which the sixth precursor and fourth precursor are both flowed into the chamber together.

In embodiments, the ALD process includes performing a grand super-cycle that includes alternately forming the film 222 and then forming the layer 225 (e.g., a Si layer or $SiO_2$ layer) on the film 222 m times. In some embodiments, m is equal to 1-100. Other values of m may also be used to achieve a target thickness of the silicon-doped hafnium-zirconium oxide film.

In some embodiments, deposition of the first layer and second layer may be performed for the same number of times, such that film 222 is formed of a metal alloy of an equal amount (or approximately equal amount) of hafnium and zirconium. Alternatively, x and y may each have different values to cause the film to have more hafnium than zirconium or more zirconium than hafnium. For example, there may be anywhere from 1-99% more zirconium than hafnium in some embodiments. In some embodiments, while the deposition cycle to deposit third layer 225 may be performed 1 time for every time 5-10 times that the super-cycle is performed (e.g., for n=5-10, z=1). In some embodiments, the thickness of the third layer 225 (silicon containing layer) may be less than that of the film 222 (hafnium-zirconium oxide film). The inventors have found that the amount of silicon present in the layers affects "pinned" AFE properties of the film layers, which can be seen FIGS. 3A-3G as described below.

A result of the sequence of repeated half reactions of the grand super-cycle may be to grow additional layers and ultimately form a silicon doped hafnium-zirconium oxide film 230 having a target thickness. The number and thickness of the layers may be selected based on the targeted coating thickness and properties. The various layers forming the silicon doped film 230 may remain intact or in some embodiments may be interdiffused. In some embodiments, an annealing process is performed after forming the silicon doped film 230 to cause the individual layers of the film to interdiffuse and form a homogenous or approximately homogenous film.

Figure 2B:
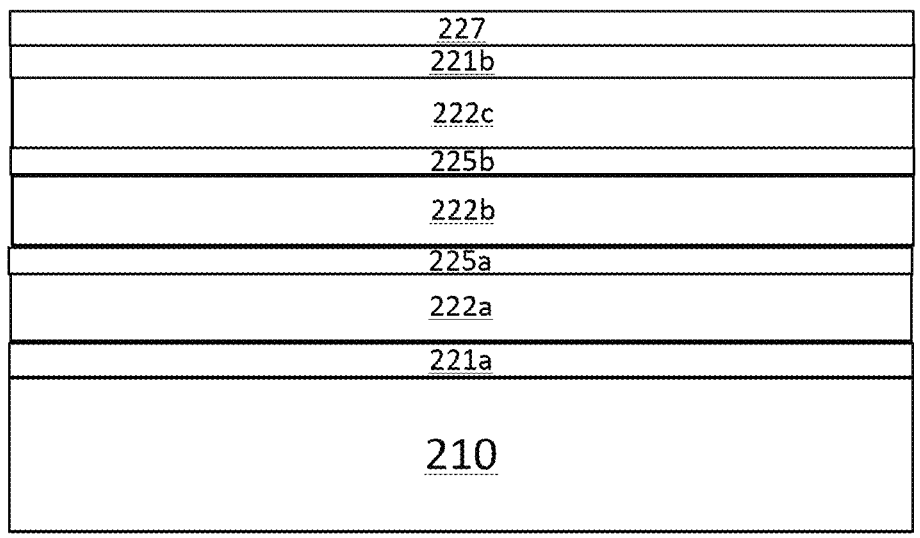
FIG. 2B depicts a sectional view of one embodiment of multiple layers of a sample that has undergone the hafnium-zirconium oxide deposition process of FIG. 2A.
Figure 3A:
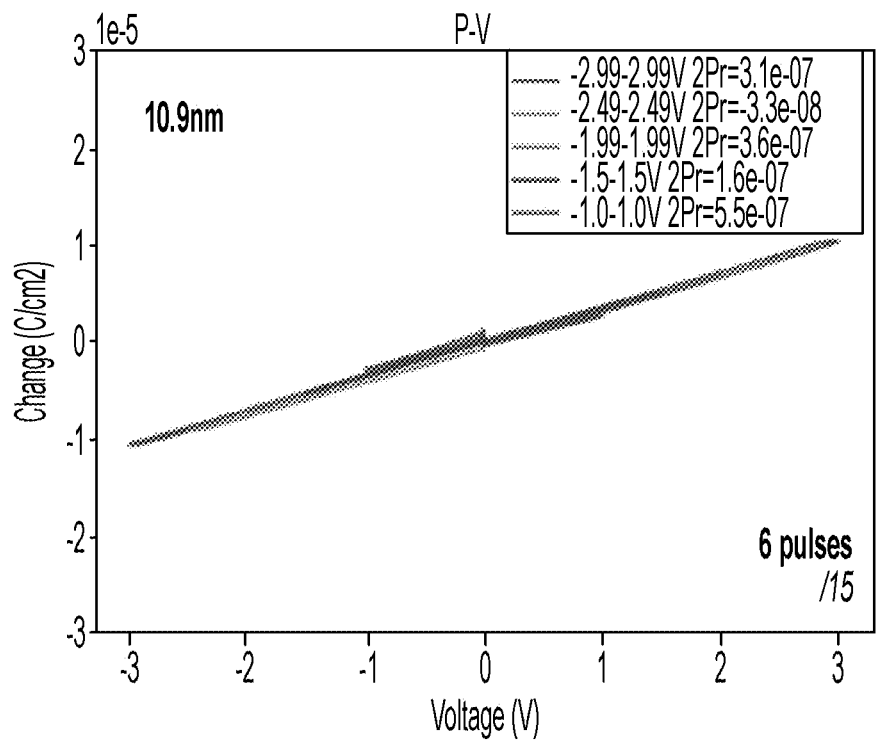
FIGS. 3A-3G represents the P-V measurement of various MIM Si-doped hafnium-zirconium oxide structures using hydrogen peroxide as precursor in the deposition process.
Figure 3B:
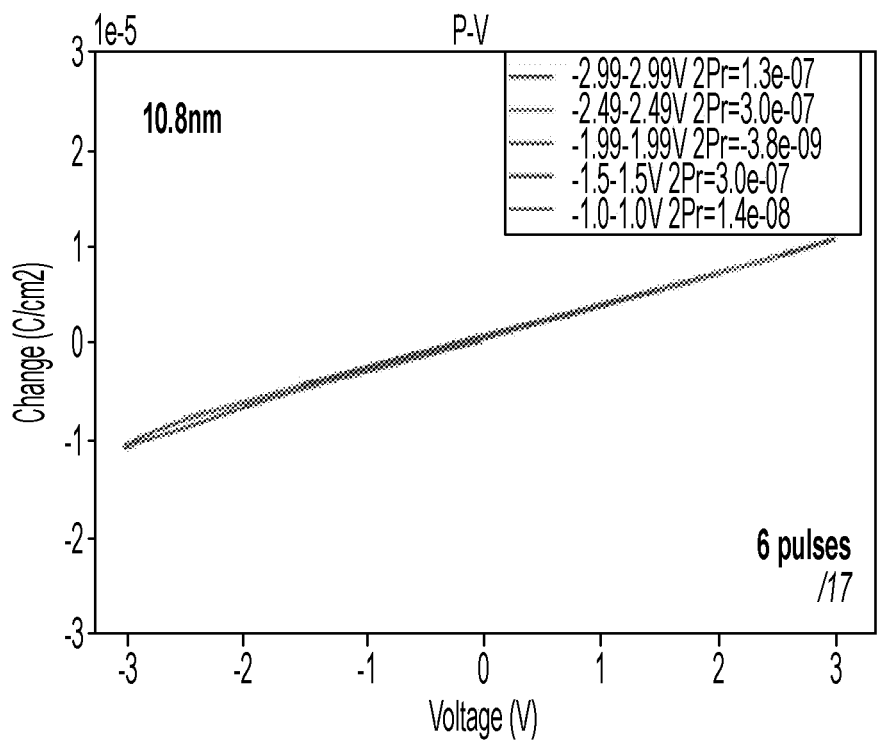
Figure 3C:
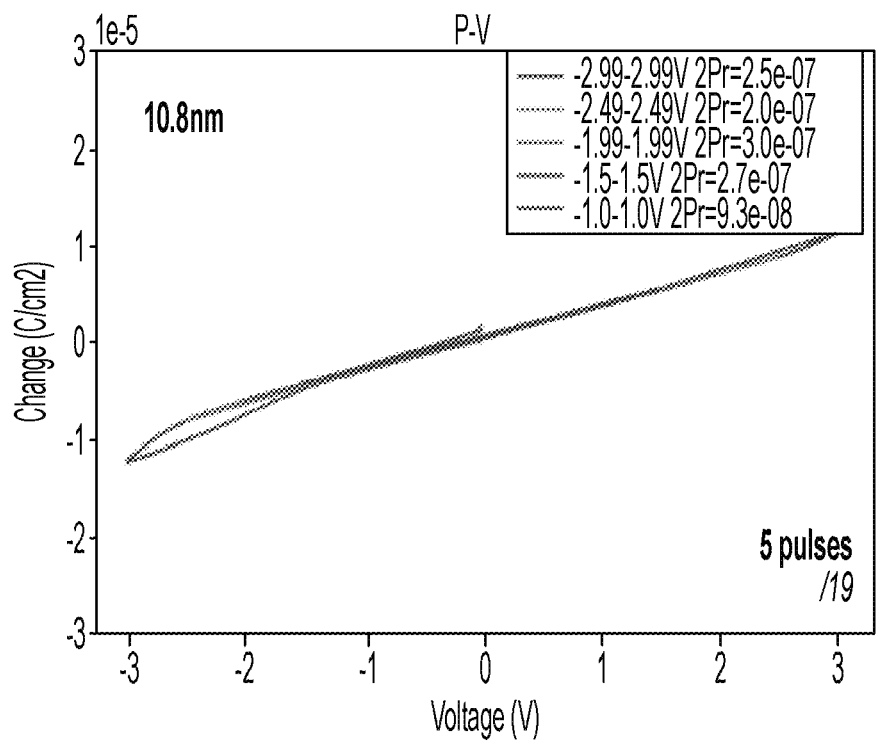
Figure 3D:
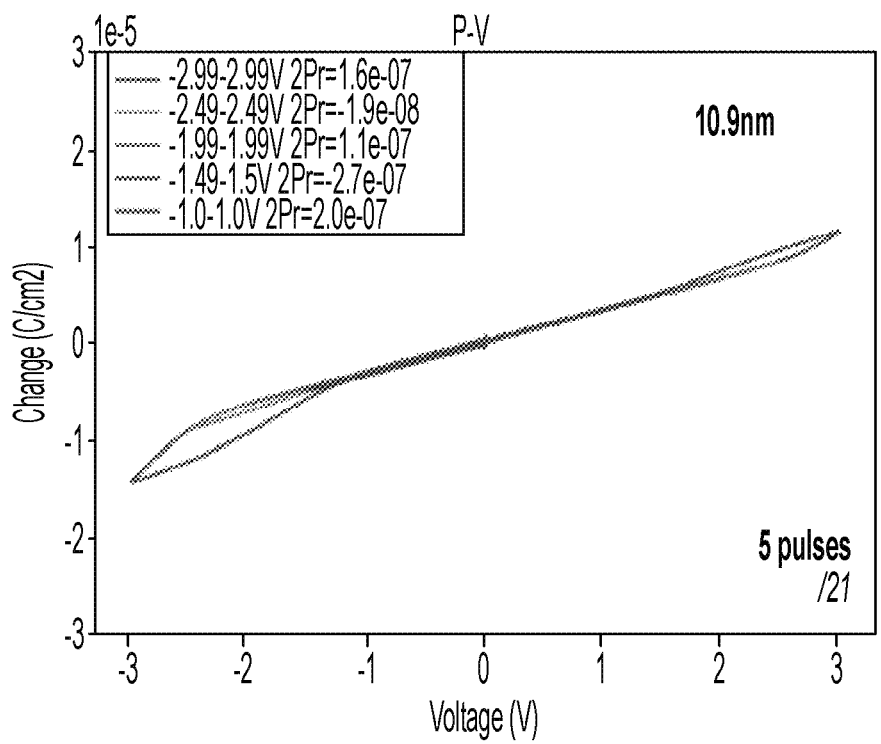
Figure 3E:
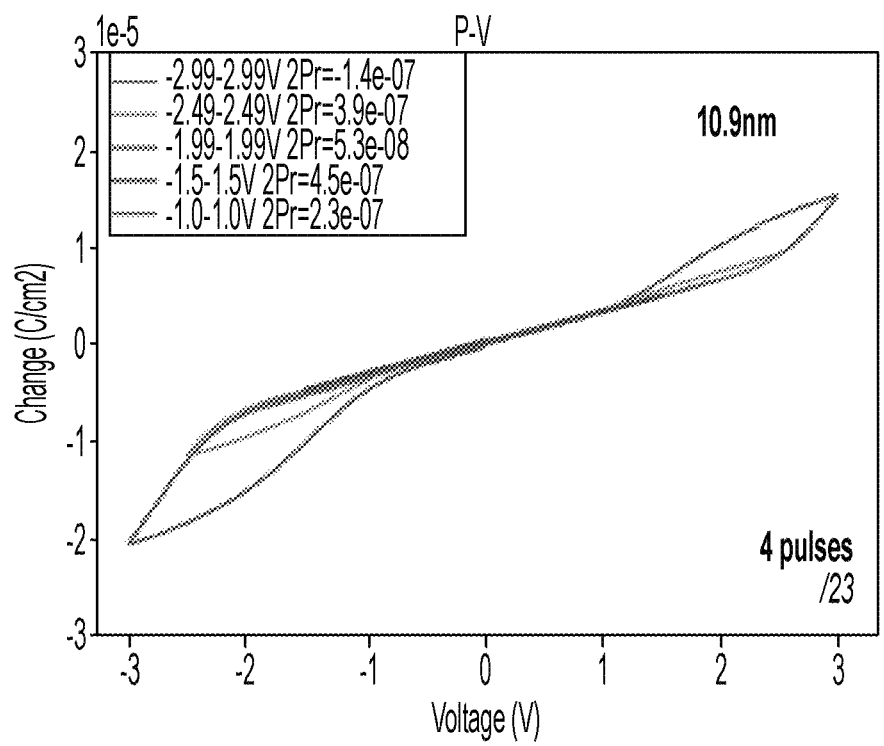
Figure 3F:
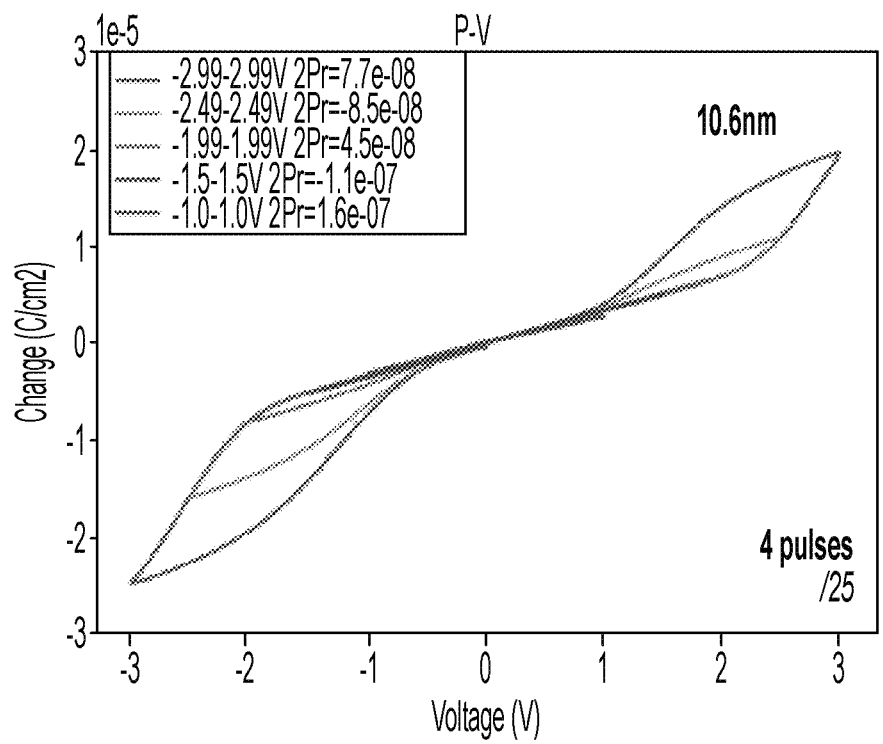
Figure 3G:
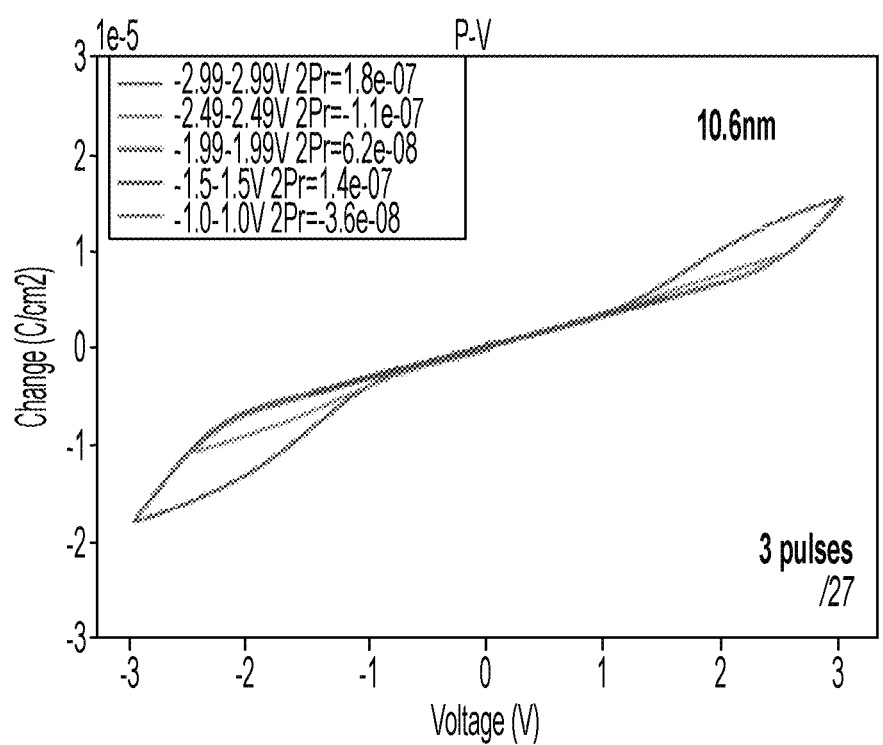
Figure 4A:
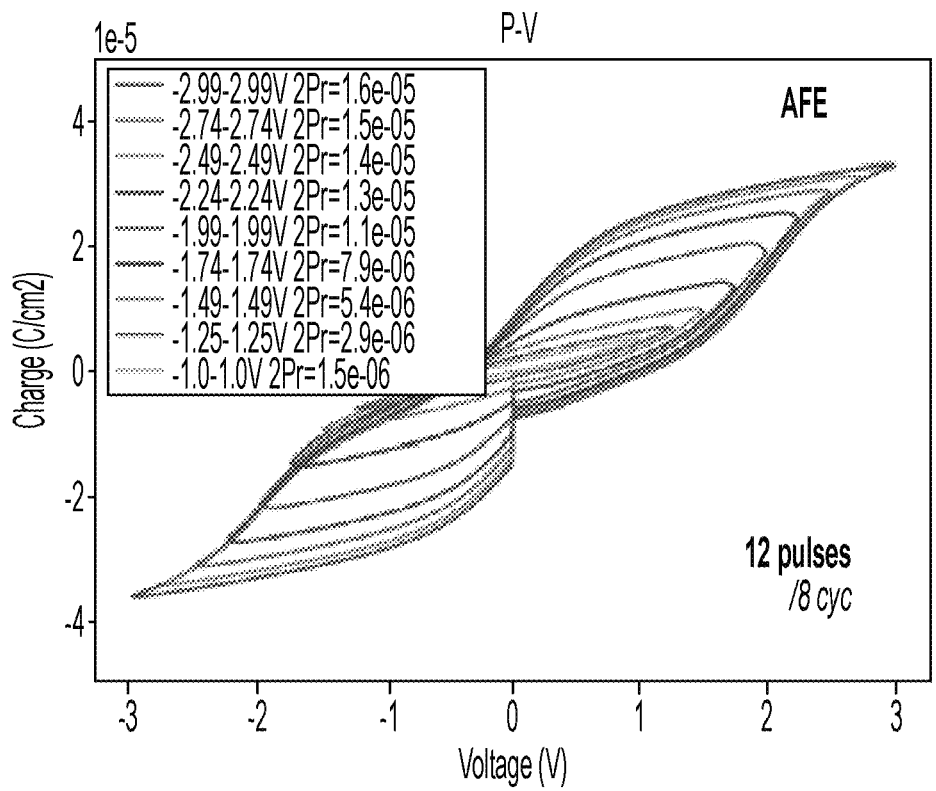
FIGS. 4A-4H represents the P-V measurement of various MIM Si-doped hafnium-zirconium oxide structures using water as precursor in the deposition process.
Figure 4B:
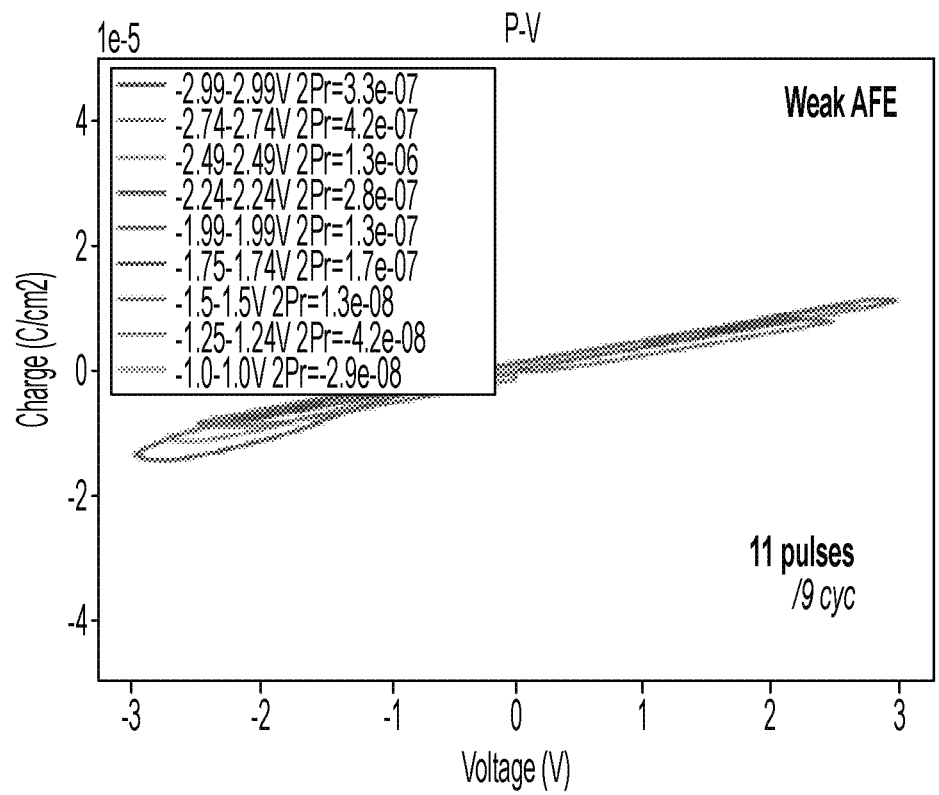
Figure 4C:
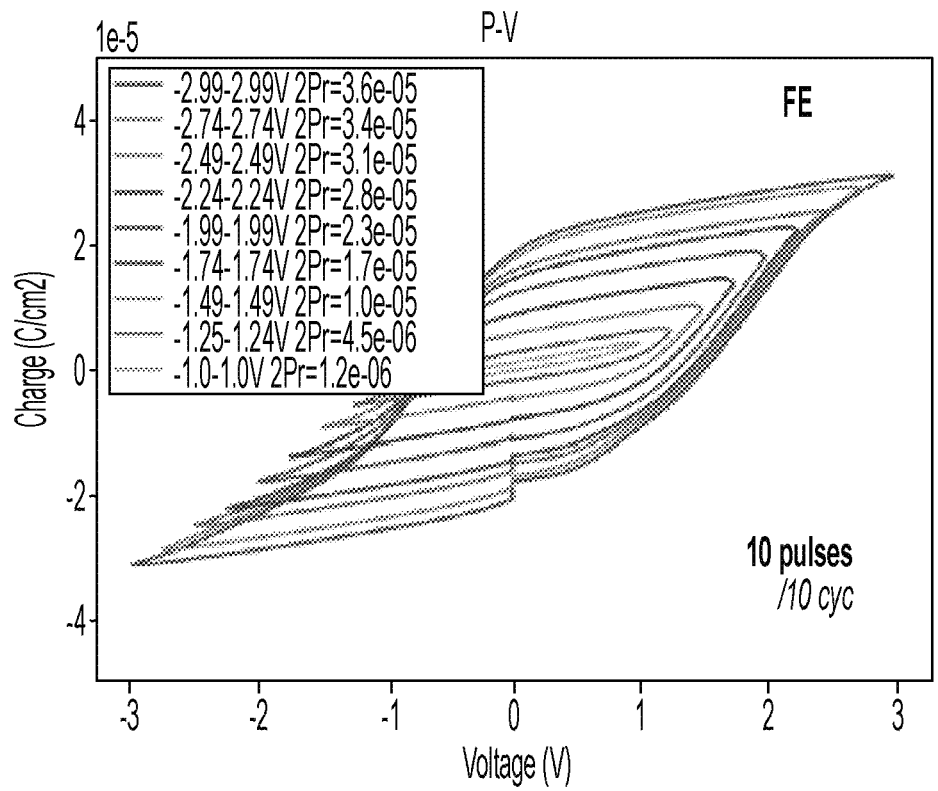
Figure 4D:
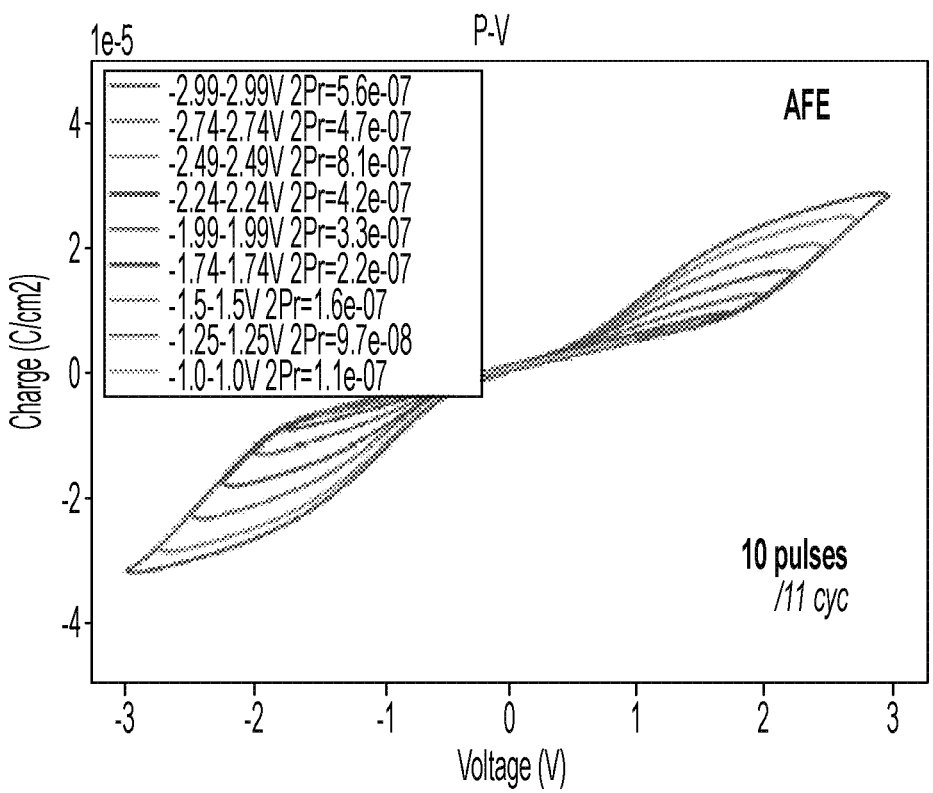
Figure 4E:
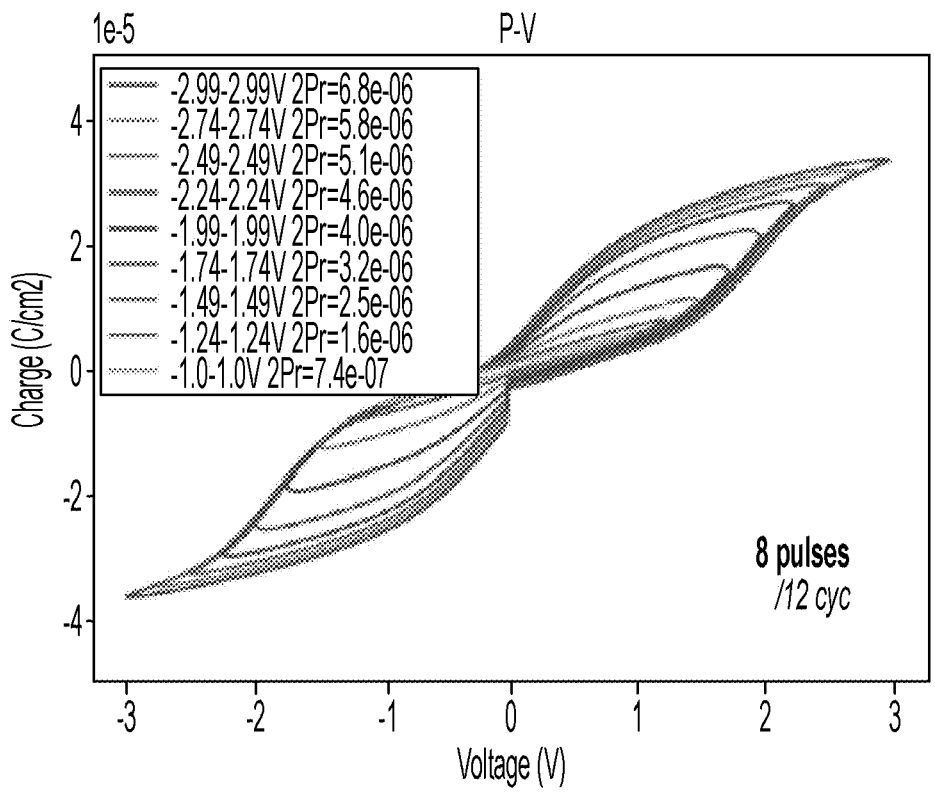
Figure 4F:
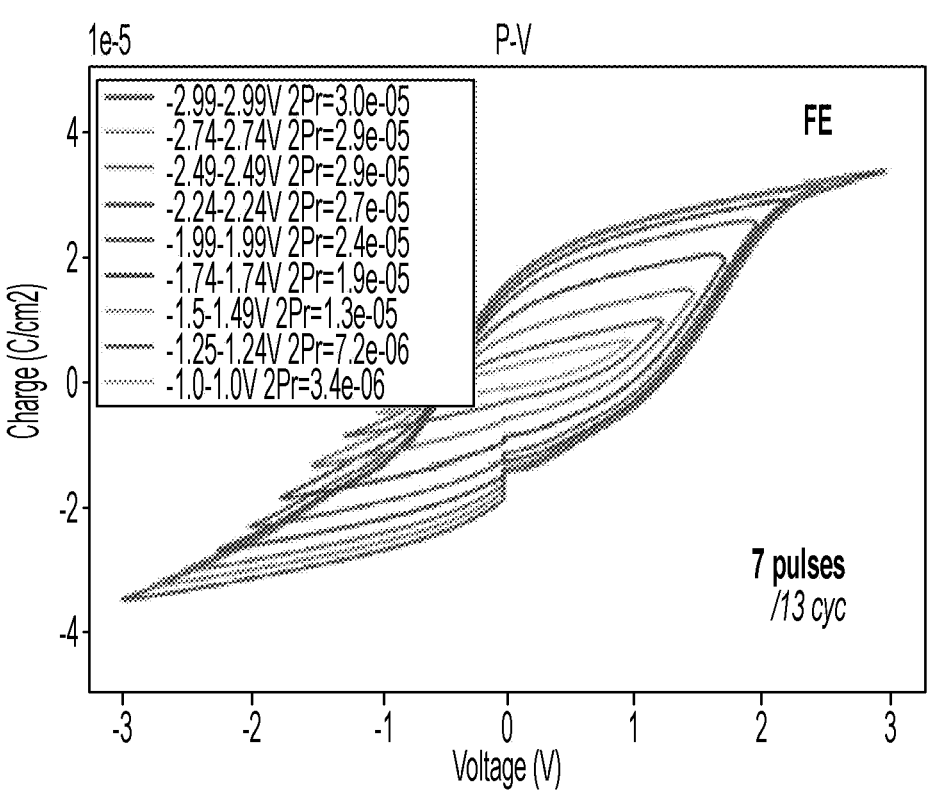
Figure 4G:
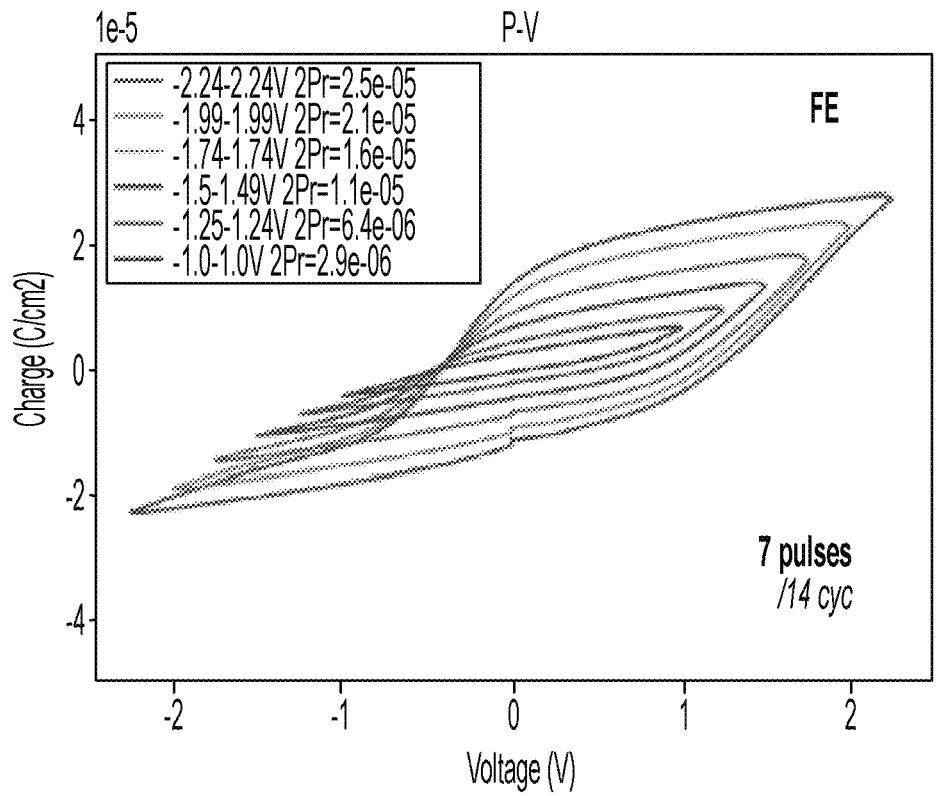
Figure 4H:
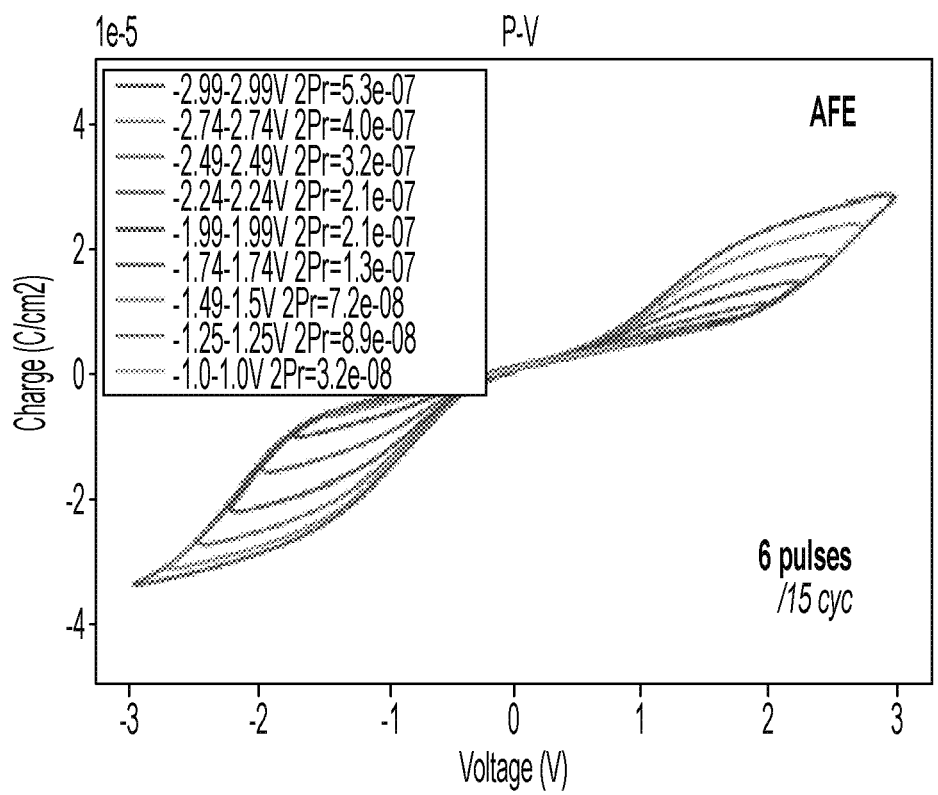

Referring to FIG. 2B, an article 210 having undergone the method as illustrated in FIG. 2A is shown. The article 210 may have a metal layer 221a. The metal layer 221a may include TiN, or W. After undergoing the ALD method as described in FIG. 2A, a film comprising layers 222a, 222b, 222c and layers 225a, 222b may be formed on the surface of the article 210 having a metal layer 221a. The film 222 a-c may be a hafnium zirconium oxide film, and the layer 225 a-b may be a silicon containing layer that provides silicon doping, as described above. After performing the ALD method of FIG. 2A, an additional metal layer 221b may be formed on the top film, 222c. The metal layer 2221b may include TiN, or W and may be formed by a sputtering process, for example. The article 210 may also include a metal coating layer 227 that is formed after performing the ALD process of FIG. 2A. The metal coating layer 227 may include Pt.

Referring to FIGS. 3A-G, P-V measurements of various metal-insulator-metal (MIM) Si-doped hafnium zirconium oxide samples prepared using $H_2O_2$ as a precursor are presented. The samples of FIGS. 3A-G represent 100 cycles (e.g., on/off cycles) of the MIM structure having a film of hafnium zirconium oxide (HZO) that was formed with $H_2O_2$ as a precursor, where a Si pulse was applied every x HZO cycles in formation of the film. As can be seen in FIGS. 3A-G, there is a clear trend in switching behavior as a function a number of Si pulses (e.g., ratio of Si to HZO). That is, when less Si pulses are applied in the deposition process for more HZO cycles, then switching begins to occur. Thus, when less Si is present in the layers, the inventors have found that switching will occur. Therefore, using $H_2O_2$ in the deposition process provides a trend in AFE switching with the Si concentration, so that switching can be controlled. In contrast, FIGS. 4A-H represents P-V measurements of various MIM Si-doped hafnium zirconium oxide samples prepared using water ($H_2O$) as a precursor during ALD, which did not show any trend when the number of Si pulses varied. Thus, if water is used as a precursor, one of skill in the art will not be able to control the FE/AFE switching. Because of the unpredictability in FIGS. 4A-H, one of skill in the art would understand that water is an unsuitable precursor for the deposition process of the present disclosure.

Figure 5:
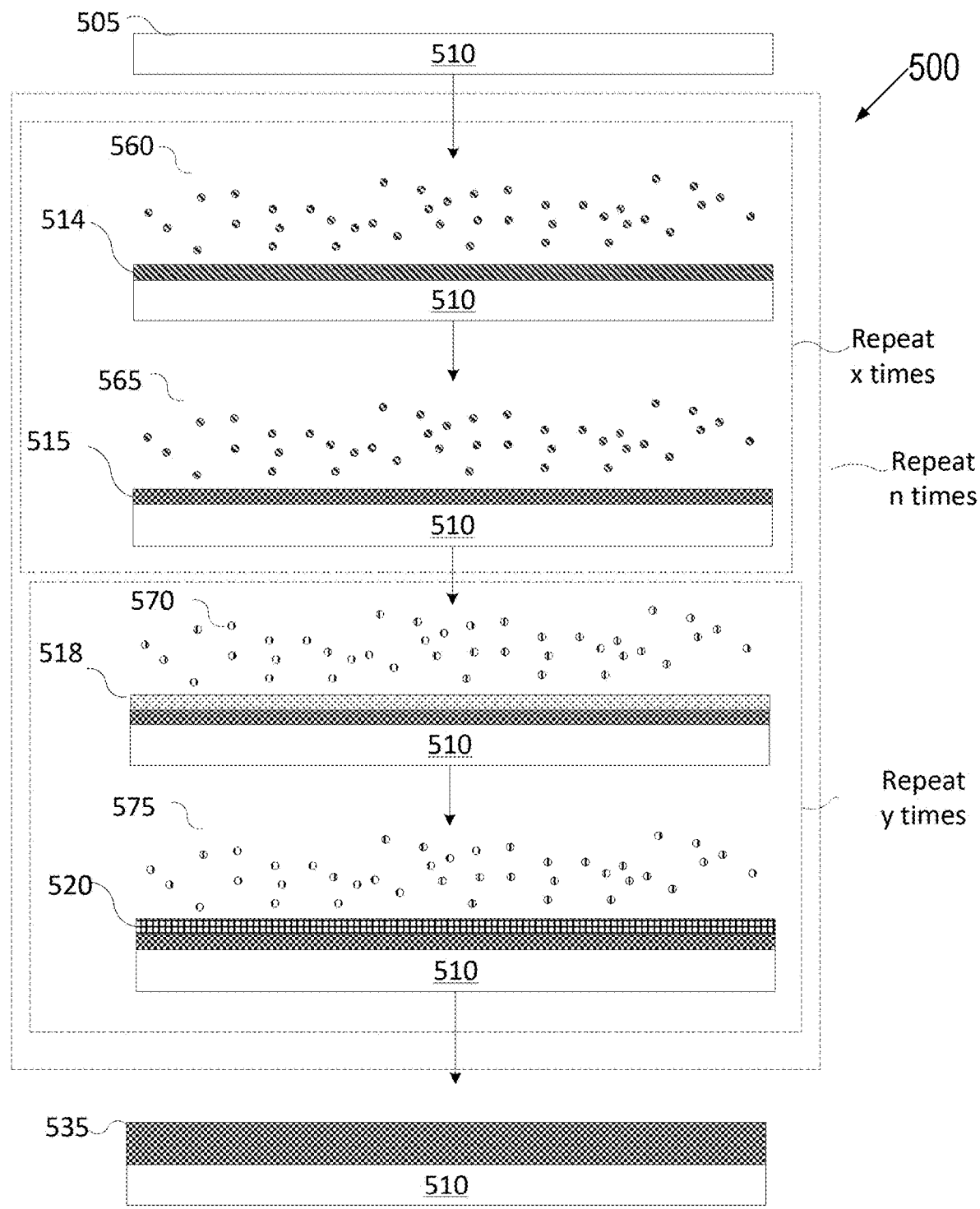
FIG. 5 depicts a zirconium-oxide deposition process in accordance with a variety of Atomic Layer Deposition techniques, according to some aspects of the present disclosure.

FIG. 5 depicts a zirconium oxide deposition process in accordance with a variety of Atomic Layer Deposition techniques, according to some aspects of the present disclosure. Referring to FIG. 5, an article 510 has a surface 505. Article 510 may represent various substrates and/or substrate types including but not limited to semiconductor wafers, LEDs (e.g., micro LEDs), glass wafers, and so on. The article 510 and surface 505 may be made from a metal (such as aluminum, stainless steel, titanium, copper, etc.), a ceramic, a metal-ceramic composite, a polymer, a polymer ceramic composite, a carbon-based material, a dielectric material, or other suitable materials, and may further comprise materials such as AlN, Si, SiC, $Al_2O_3$, $SiO_2$, TiN, Ru, GaN, and so on.

ALD may be performed by alternately exposing the article to two or more precursors and/or reactants. Each individual chemical reaction between a precursor and the surface is known as a "half-reaction." During each half reaction, a precursor or reactant is pulsed onto the surface for a period of time sufficient to allow the precursor or reactant to fully react with the surface (e.g., adsorb onto the surface). The reaction is self-limiting as the precursor/reactant will only react with a finite number of available reactive sites on the surface, forming a uniform continuous adsorption layer on the surface. Any sites that have already reacted with a precursor/reactant will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

The surface reactions (e.g., half-reactions) are done sequentially. Prior to introduction of a new precursor, the chamber in which the ALD process takes place may be purged with an inert carrier gas (such as nitrogen or air) to remove any unreacted precursor and/or surface-precursor reaction byproducts. At least one precursor is used at a time. In some embodiments, more than one precursor may be used to grow film layers having the same composition (e.g., to grow multiple layers of zirconium oxide on top of each other). In some embodiments, different precursors may be used to grow different film layers having different compositions.

As illustrated in FIG. 5, article 510 having surface 505 may be introduced to a first precursor 560 for a first duration until a first half reaction of the first precursor 560 with surface 505 partially forms layer 515 by forming an adsorption layer 514. Subsequently, article 510 may be introduced to a second precursor 565 (also referred to as a reactant) to cause a second half reaction to react with the adsorption layer 514 and fully form the layer 515. The first precursor 560 may be an oxygen containing precursor. In some examples, the first precursor 560 includes $H_2O_2$.

The second precursor 565 may be a zirconium-containing precursor. In some embodiments, the second precursor 565 may be tetrakis(ethylmethylamido)zirconium, tetrakis(dimethylamido)zirconium, tetrakis(diethylamido)zirconium, zirconium (IV) tert-butoxide, zirconium (IV) bromide, $ZrCl_4$, or a combination thereof. Layer 515 may be uniform, continuous, and conformal. In embodiments, layer 515 is a zirconium oxide layer.

The article 510 may alternately be exposed to the first precursor 560 and second precursor 565 up to x number of times to achieve a target thickness for the layer 515. X may be an integer from 1 to 100, for example. In some examples, X is approximately 5.

The article 510 having surface 505 may then be introduced to a third precursor 570 for a duration until a first half reaction of the third precursor 570 with fully form layer 515 partially forms layer 520 by forming an adsorption layer 518. Subsequently, article 510 may be introduced to a fourth precursor 575 (also referred to as a reactant) to cause a second half reaction to react with the adsorption layer 518 and fully form the layer 520. The third precursor 570 may be an oxygen containing precursor. In some examples, the third precursor 570 includes $H_2O_2$.

The fourth precursor 575 may be a silicon-containing precursor. In some embodiments, the fourth precursor 575 may be silane, $SiCl_4$, tetrakis(dimethylamino)silicon, tris(dimethylamino)silane or a combination thereof. Layer 520 may be uniform, continuous, and conformal. The article 510 may alternately be exposed to the third precursor 570 and fourth precursor 575 up to y number of times to achieve a target thickness for the layer 520. Y may be an integer from 1 to 100, for example. In some examples, Y is approximately 1. The amount of silicon present in the silicon doped zirconium oxide film may affect the amount of ferroelectric and antiferroelectric switching of devices (e.g., memory devices) created using the silicon doped zirconium oxide film upon application of electric fields. The atomic layer deposition process may be repeated up to n number of times to achieve a target thickness of the silicon-doped zirconium oxide layer. N may be an integer from 1 to 100, for example.

A result of the sequence of repeated half reactions may be to grow additional layers and ultimately form a silicon doped zirconium oxide film 535. The number and thickness of the layers may be selected based on the targeted coating thickness and properties. The various layers forming the silicon doped film 535 may remain intact or in some embodiments may be interdiffused. In some embodiments, an annealing process is performed after forming the silicon doped film 535 to cause the individual layers of the film to interdiffuse and form a homogenous or approximately homogenous film.

In some embodiments, rather than flowing the silicon-containing precursor to deposit a Silicon containing layer after forming the zirconium oxide layers, a silicon-containing precursor may be flowed into the chamber at the same time as the zirconium-containing precursor. This technique is referred to herein as co-dosing. The ratio of the silicon-containing precursor to the zirconium-containing precursors may be set such that there is a much smaller amount of silicon than zirconium in the coating. In one embodiment, the ratio of the silicon-containing precursor to the zirconium containing precursors is 1:5 to 1:100. In another embodiment, the ratio of the silicon-containing precursor to the zirconium-containing precursor is 1:5 to 1:30. In some embodiments, the silicon-containing precursor is not injected into the chamber every cycle in which the zirconium-containing precursor is injected into the chamber. For example, three to eight cycles of flowing the first and second precursors into the chamber may be performed without flowing the silicon-containing precursor into the chamber, followed by a single cycle in which the third precursor and fourth precursor are both flowed into the chamber together.

ALD processes may be conducted at various temperatures depending on the type of ALD process. The optimal temperature range for a particular ALD process is referred to as the "ALD temperature window." Temperatures below the ALD temperature window may result in poor growth rates and/or non-ALD type deposition. Temperatures above the ALD temperature window may result in thermal decomposition of the article and/or rapid desorption of the precursor. The ALD temperature window for depositing hafnium-zirconium oxide may range from about 20° C. to about 400° C. In some embodiments, the ALD temperature window is between about 150° C. and 350° C. In some embodiments, the ALD temperature window is between about 200° C. and 300° C.

ALD processes may be conducted at various pressures depending on the type of ALD process. The optimal pressure range for a particular ALD process is referred to as the "ALD pressure window." The ALD pressure window for depositing hafnium-zirconium oxide may range from about 1 Torr to about 20 Torr. In some embodiments, the ALD pressure window is between about 1 Torr and 4 Torr. In some embodiments, the ALD pressure window is between about 2 Torr and 4 Torr.

The ALD process allows for conformal film layers having uniform film thickness on articles and surfaces having complex geometric shapes and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets).

With the ALD technique, silicon-doped hafnium-zirconium oxide films can be grown, for example, by proper sequencing of the precursors used to grow hafnium-zirconium oxide and to dope with silicon, as illustrated in more detail in the examples below. Furthermore, silicon-doped zirconium oxide films can be grown, for example, by proper sequencing of the precursors used to grow zirconium oxide and to dope with silicon.

Figure 6:
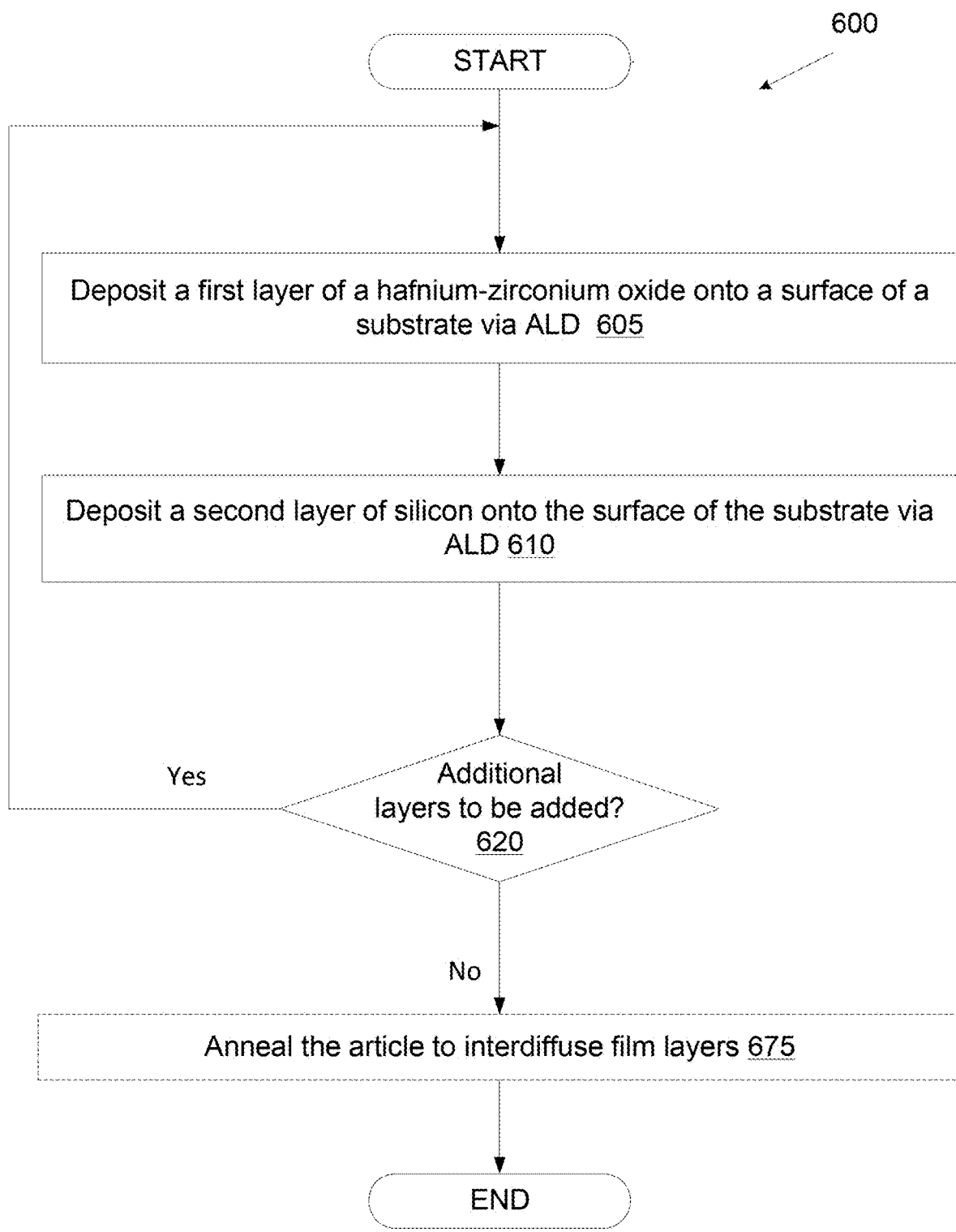
FIG. 6 is a flow chart representing a method for forming a Si-doped hafnium-zirconium oxide film.

FIG. 6 illustrates a method 600 for forming a silicon-doped hafnium-zirconium oxide layer on a surface of a substrate (e.g., an article) according to some aspects of the present disclosure. Pursuant to block 605, the method includes depositing a first film layer of hafnium-zirconium oxide onto a surface of an article (e.g., the substrate). The first film layer is grown from at least one precursor using an ALD process as described in FIG. 2A. Pursuant to block 610, the method includes depositing one or more second film layers of silicon onto the surface of the article. The one or more second film layers are grown from the at least one precursor using the ALD process.

In some embodiments, the first film layer may be formed by the following process sequence:
1) Reaction of a first precursor with the surface of the substrate. The first precursor may include $H_2O_2$.
2) Purging of non-reacted precursor from the ALD process chamber.
3) Reaction of a hafnium-containing precursor with the surface. The hafnium-containing precursor may include bis(cyclopentiadienyl)dimethylhafnium, bis(methylcyclopentadienyl)dimethylhafnium, bis(methylcyclopentadienyl)methoxymethylhafnium, hafnium(IV) t-butoxide, hafnium(IV) ethoxide, tetrakis(diethylamino) hafnium, tetrakis(ethylmethylamino)hafnium, tetrakis (2,2,6,6-tetramethyl-3,5-heptanedionato)hafnium(IV), $HfCl_4$, HfCp, or a combination thereof. In some embodiments, the hafnium-containing precursor may be tetrakis(dimethylamino)hafnium.
4) Purging of the non-reacted precursor from the ALD process chamber.
5) Reaction of a second precursor with the layer including hafnium. The second precursor may include $H_2O_2$.
6) Purging of non-reacted precursor from the ALD process chamber.
7) Reaction of a zirconium-containing precursor with the surface. The zirconium-containing precursor may include tetrakis(ethylmethylamido)zirconium, tetrakis (dimethylamido)zirconium, tetrakis(diethylamido)zirconium, zirconium (IV) tert-butoxide, zirconium (IV) bromide, $ZrCl_4$, or a combination thereof. In some embodiments, the zirconium-containing precursor may be tetrakis(dimethylamido)zirconium.
8) Purging of non-reacted precursor form the ALD process chamber.

In the above process sequence, operations 1-4 may be repeated multiple times prior to performance of subsequent operations. Similarly, operations 5-8 may be repeated multiple times. After performing operations 5-8 one or more times, operations 1-4 may again be repeated one or more additional times, followed by operations 5-8 one or more additional times, and so on until a hafnium-zirconium oxide layer having a target ratio of hafnium to zirconium and a target thickness is achieved.

In some embodiments, the second film layer may be formed by the following process sequence:
1) Reaction of a third precursor with the surface of the substrate. The third precursor may include $H_2O_2$.
2) Purging of non-reacted precursor from the ALD process chamber.
3) Reaction of a silicon-containing precursor with the surface. The silicon-containing precursor may include silane, $SiCl_4$, tetrakis(dimethylamino)silicon or a combination thereof.
4) Purging of the non-reacted precursor from the ALD process chamber.

Operations 1-4 may be performed one or more times to control an amount of silicon doping of the hafnium-zirconium oxide layer.

The precursors listed above or any other suitable precursors may be used each time a silicon-doped hafnium-zirconium oxide layer is grown using ALD, regardless of whether it is the first, second, or Nth layer, where the Nth layer would represent the finite number of layers grown on the surface of the substrate and selected based on targeted thickness. In some embodiments, the targeted thickness may be less than about 5 nanometers. However, other thicknesses may also be achieved, such as 1-4 nm, 6-10 nm, and so on.

In some embodiments, pursuant to block 615, the method may further include determining whether additional layers are to be added. Determining whether additional layers and/or how many layers are to be added can be either done in-situ, or prior to initiating the depositions (e.g., in the optional multi-component composition selection process). If additional layers are to be added, blocks 605 and 610 may be repeated. If no additional layers are to be added, the method ends, forming a silicon-doped hafnium-zirconium oxide film comprising all layers deposited onto the surface of the article. In some embodiments, at block 675 the article comprising the one or more first layers and one or more second layers is annealed to interdiffuse the layers. The annealing may occur at a temperature between about 400° C. to about 600° C.

Figure 7:
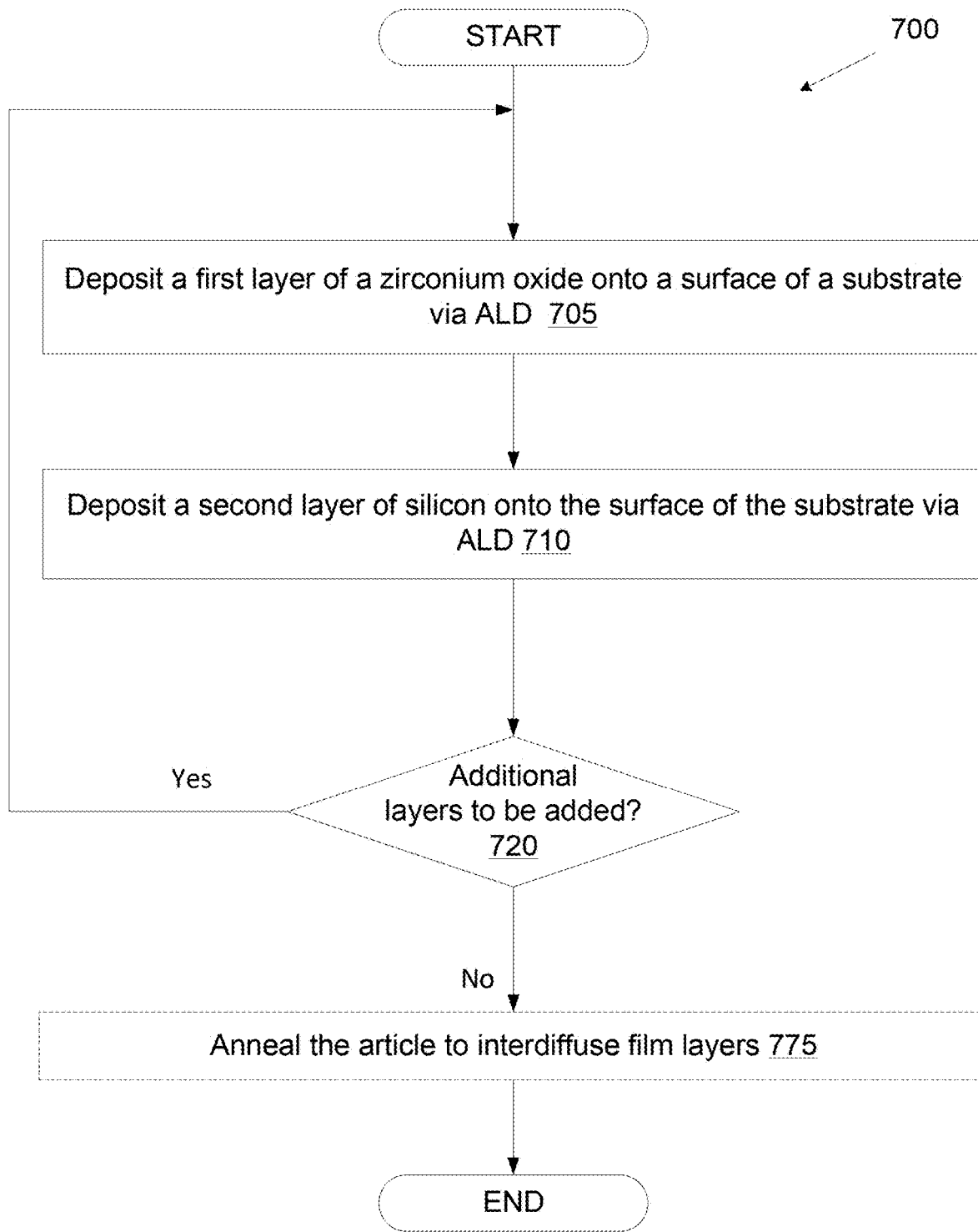
FIG. 7 is a flow chart representing a method for forming a Si-doped zirconium oxide film.

FIG. 7 illustrates a method 700 for forming a silicon-doped hafnium oxide layer on a surface of a substrate (e.g., an article) according to some aspects of the present disclosure. Pursuant to block 705, the method includes depositing a first film layer of zirconium oxide onto a surface of an article (e.g., the substrate). The first film layer is grown from at least one precursor using an ALD process as described in FIG. 5. Pursuant to block 710, the method includes depositing one or more second film layers of silicon onto the surface of the article. The one or more second film layers are grown from the at least one precursor using the ALD process.

In some embodiments, the first film layer may be formed by the following process sequence:
1) Reaction of a first precursor with the surface of the substrate. The first precursor may include $H_2O_2$.
2) Purging of non-reacted precursor from the ALD process chamber.
3) Reaction of a zirconium-containing precursor with the surface. The zirconium-containing precursor may include tetrakis(ethylmethylamido)zirconium, tetrakis(dimethylamido)zirconium, tetrakis(diethylamido)zirconium, zirconium (IV) tert-butoxide, zirconium (IV) bromide, $ZrCl_4$, or a combination thereof. In some embodiments, the zirconium-containing precursor may be tetrakis(dimethylamido)zirconium.
4) Purging of non-reacted precursor form the ALD process chamber.

In some embodiments, the second film layer may be formed by the following process sequence:
1) Reaction of a second precursor with the surface of the substrate. The second precursor may include $H_2O_2$.
2) Purging of non-reacted precursor from the ALD process chamber.
3) Reaction of a silicon-containing precursor with the surface. The silicon-containing precursor may include silane, $SiCl_4$, tetrakis(dimethylamino)silicon or a combination thereof.
4) Purging of the non-reacted precursor from the ALD process chamber.

The precursors listed above or any other suitable precursors may be used each time a silicon-doped zirconium oxide layer is grown using ALD, regardless of whether it is the first, second, or Nth layer, where the Nth layer would represent the finite number of layers grown on the surface of the substrate and selected based on targeted thickness. In some embodiments, the targeted thickness may be less than about 5 nanometers.

In some embodiments, pursuant to block 715, the method may further include determining whether additional layers are to be added. Determining whether additional layers and/or how many layers are to be added can be either done in-situ, or prior to initiating the depositions (e.g., in the optional multi-component composition selection process). If additional layers are to be added, blocks 705 and 710 may be repeated. If no additional layers are to be added, the method ends, forming a silicon-doped hafnium-zirconium oxide comprising all film layers deposited onto the surface of the article.

An electrode for a memory device having a silicone doped oxide film according to one of the methods described herein is also prepared. The electrode may include a metal layer. The metal layer may include TiN, or W, or a combination thereof. The metal layer may be applied to the device through a sputtering process as known in the art.

EXAMPLES

The methods of embodiments of the present disclosure are described herein by the following examples. It is understood that the examples are not to be limiting.

Example 1: Endurance Cycle Study

Figure 8:
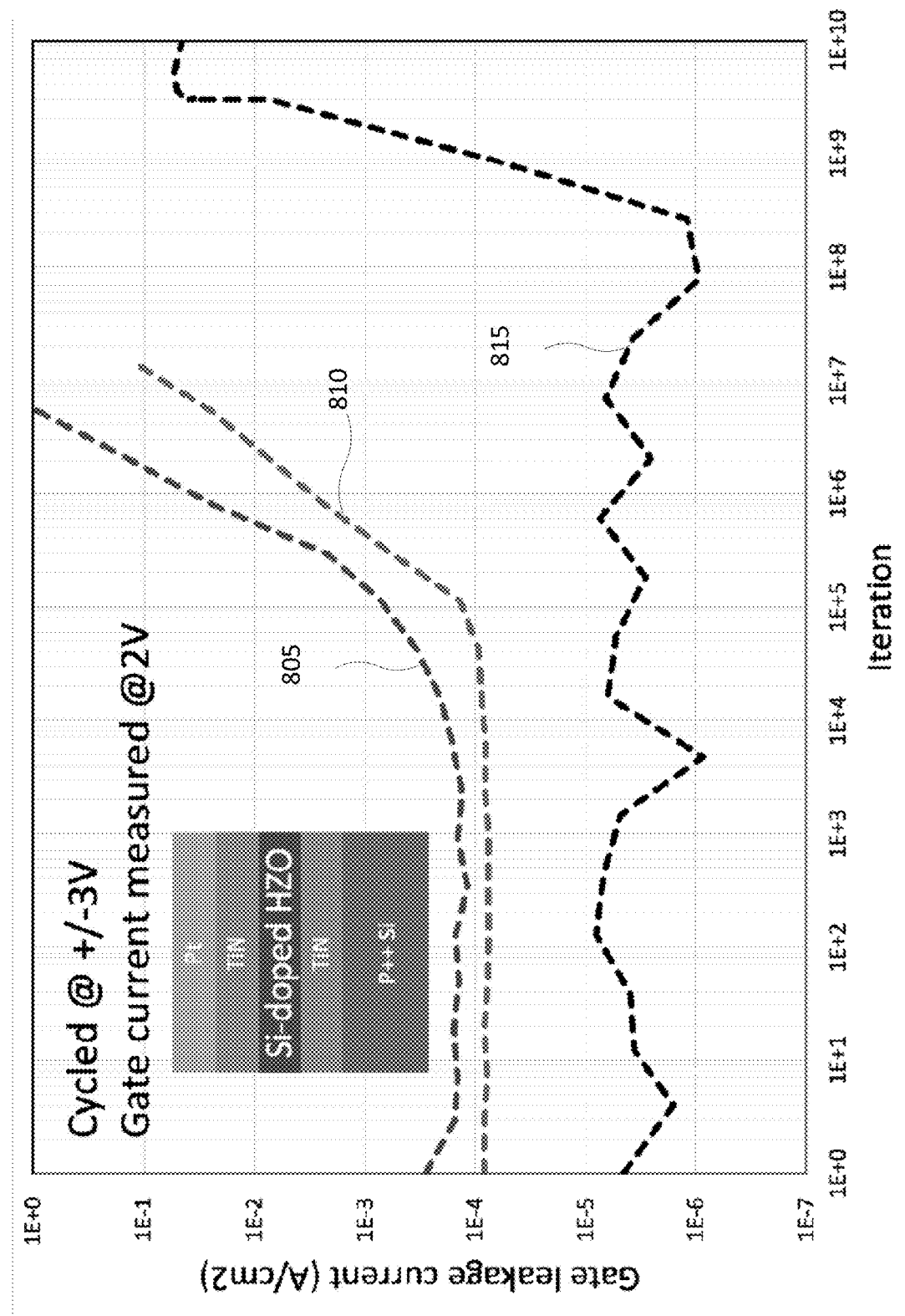
FIG. 8 represents the results of endurance cycles and gate leakage current for ferroelectric, antiferroelectric and "pinned" AFE Si-doped hafnium-zirconium oxide (HZO) samples according to an Example 1.

Endurance cycles and gate leakage current for ferroelectric, antiferroelectric and "pinned" AFE Si-doped hafnium-zirconium oxide (HZO) samples were studied. The results of this study are illustrated in FIG. 8 As can be seen in FIG. 8, samples having FE/AFE switching showed poor endurance and early breakdown, around $10^5$ cycles, when compared to "pinned" AFE samples, which endured about $10^{10}$ cycles. The FE film prepared as known in the art is shown in 805, and the AFE film as known in the art is shown in 810. The pinned AFE sample is shown in 815. High endurance of films results in reliable high-k films. FE and AFE films are known to have poor endurance, which makes them less suitable for memory application where $10^{10}$ or more endurance cycles is anticipated. In this work, Si-doping using $H_2O_2$ has shown to allow control over the AFE switching. FIG. 8 shows gate leakage as a function of endurance cycle. As expected, FE and AFE films with high switching show poor endurance and the devices start to fail after $10^5$ cycles whereas the pinned AFE films show much higher endurance consistent with the lack of switching. This makes pinned Si-doped films a good candidate for DRAM application. Films formed in accordance with methods described herein (e.g., Si-doped hafnium-zirconium oxide films formed using $H_2O_2$ as an oxygen containing precursor) are pinned AFE films.

Example 2: MIM and MIS Study

Scaled MIM (metal-insulated-metal) and MIS (metal-insulated-semiconductor) samples were prepared and studied in accordance with embodiments of the present disclosure. HZO with 1:1 Hf:Zr ratio is known to show FE switching; however, use of an HOOH precursor may lead to Ti diffusion from TiN substrate into the HZO film. Small amounts of Ti are known to stabilize the AFE phase in HZO. A reduction in switching in C-V and P-V for the undoped HZO samples with TiN electrodes was observed according to embodiments. This leads to almost dielectric like behavior while still retaining the high-k of the tetragonal AFE phase. This condition is favorable for DRAM application since use of FE/AFE films makes the circuits more complicated as the capacitance is not fixed due FE/AFE switching. Samples with sputtered W electrodes were fabricated since W is known to show enhanced FE/AFE switching in HZO films. Undoped HZO with 1:1 Hf:Zr and W electrodes formed using an HOOH precursor according to embodiments shows only FE switching and no AFE switching with record high capacitance.

MIM samples made with $H_2O_2$ and W electrodes show a record low EOT of 2.3 angstroms and record k of 88. A Si-doped pinned AFE sample with dielectric like properties shows higher k and lower EOT than all FE/AFE devices in literature.

Undoped HZO on W and Si-doped HZO with W electrodes are expected to show similar trend as seen with TiN with pinned AFE phase and high k (expected k with W>60) with no hysteresis.

Due to grain structure or chemistry of the high-k films described in embodiments herein, 5 nm films in this work show much lower gate leakage than existing devices in the literature. Si-doped films described herein have shown to suppress gate leakage and lower EOT which makes embodiments useful for high quality gate oxide fabrication. Thinner films manufactured according to embodiments herein are expected to further lower EOT while maintaining low gate leakage.

Figure 9:
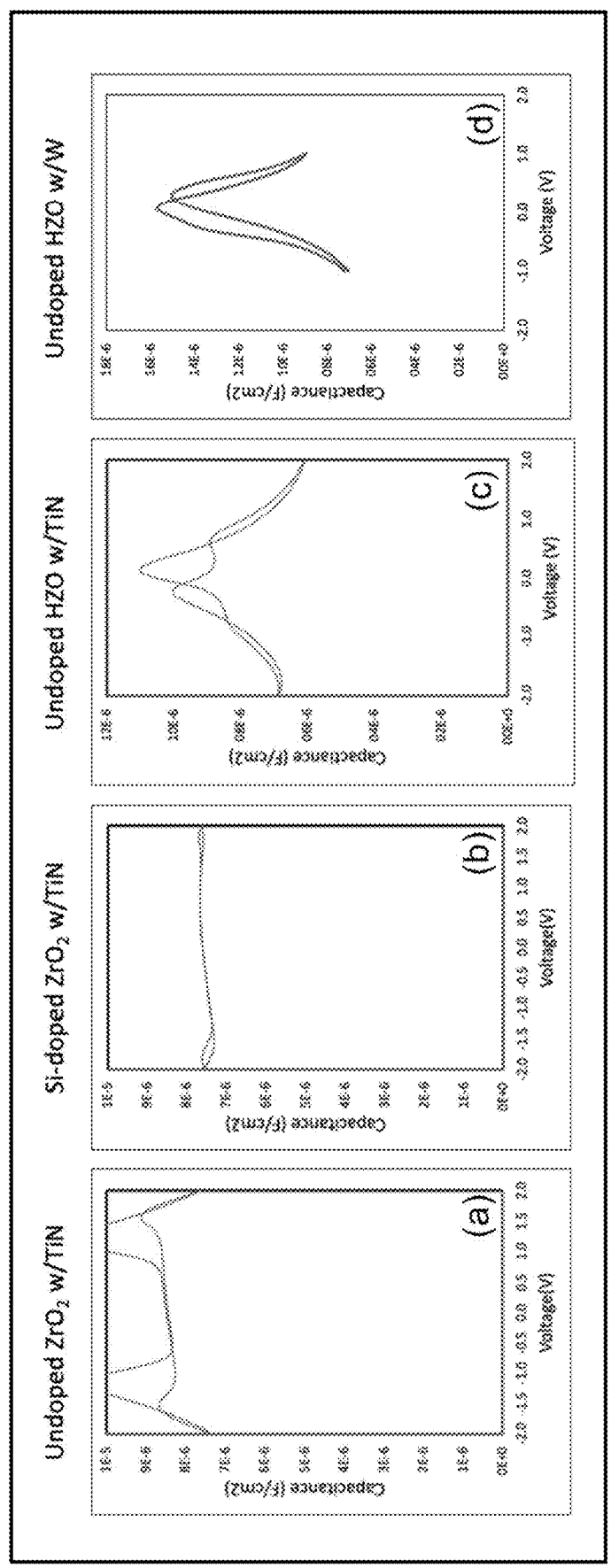
FIG. 9 represents the C-V measurements for zirconium oxide and hafnium-zirconium oxide MIM structures according to an Example of the present disclosure.

To prepare the samples, first 5 nm hafnium-zirconium oxide (HZO) and 5 nm $ZrO_2$ MIM samples with sputtered TiN electrodes were fabricated. As can be seen in FIG. 9, only (b) was doped according to the atomic layer deposition as described here in to form a Si-doped zirconium oxide layer in combination with TiN. The remaining samples (a, c and d) were undoped. As can be seen in FIG. 9, Sample (a) was undoped zirconium oxide layer with TiN; sample (c) was undoped hafnium zirconium oxide layer with TiN; and sample (d) was undoped hafnium zirconium oxide with w. After the samples were fabricated, coercive voltage (C-V) measurements were taken after post metallization and annealing at 600° C., which are shown in FIG. 9. As can be seen in FIG. 9, undoped HZO with TiN electrodes showed 4 switching peaks in the C-V consistent with presence of the AFE phase. From these results, it was found that undoped $ZrO_2$ was AFE, and Si-doping increased the coercive voltage. Undoped HZO is FE, and Si-doping favored AFE tetragonal phase formation. Thus, Si-doping sample of (b) was confirmed to achieve the "pinned AFE" state in accordance with the present disclosure.

Figure 10:
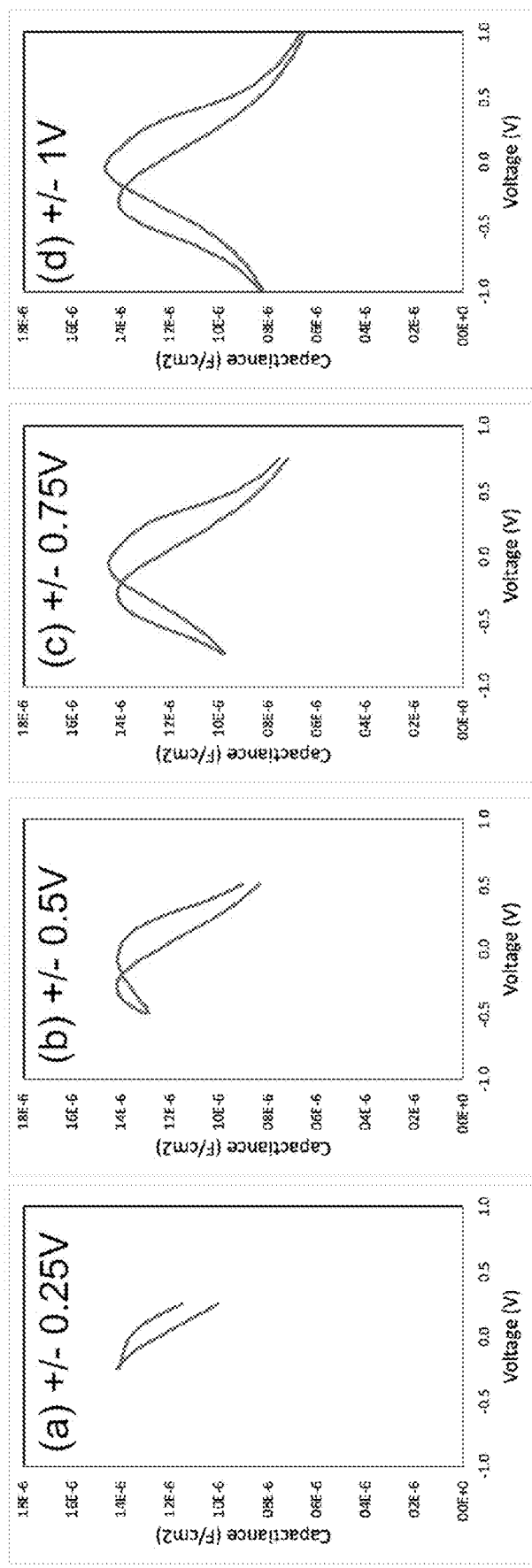
FIG. 10 represents the C-V measurements of W/HZO/W MIM samples according to an Example of the present disclosure.

Si doped films with a tungsten (W) electrode also showed hysteresis free high-k on W. The MIM sample was prepared to have W/HZO/W layers, where C-V measurements were taken over various bias voltages (+/−0.25V-+/−1V). MIM samples made using hydrogen peroxide showed 50% improvement in capacitance with TiN and 100% improvement with W when compared with existing data in the literature. The results of the C-V measurements of the W sample are shown in FIG. 10.

Example 3: High-k Value

Figure 11:
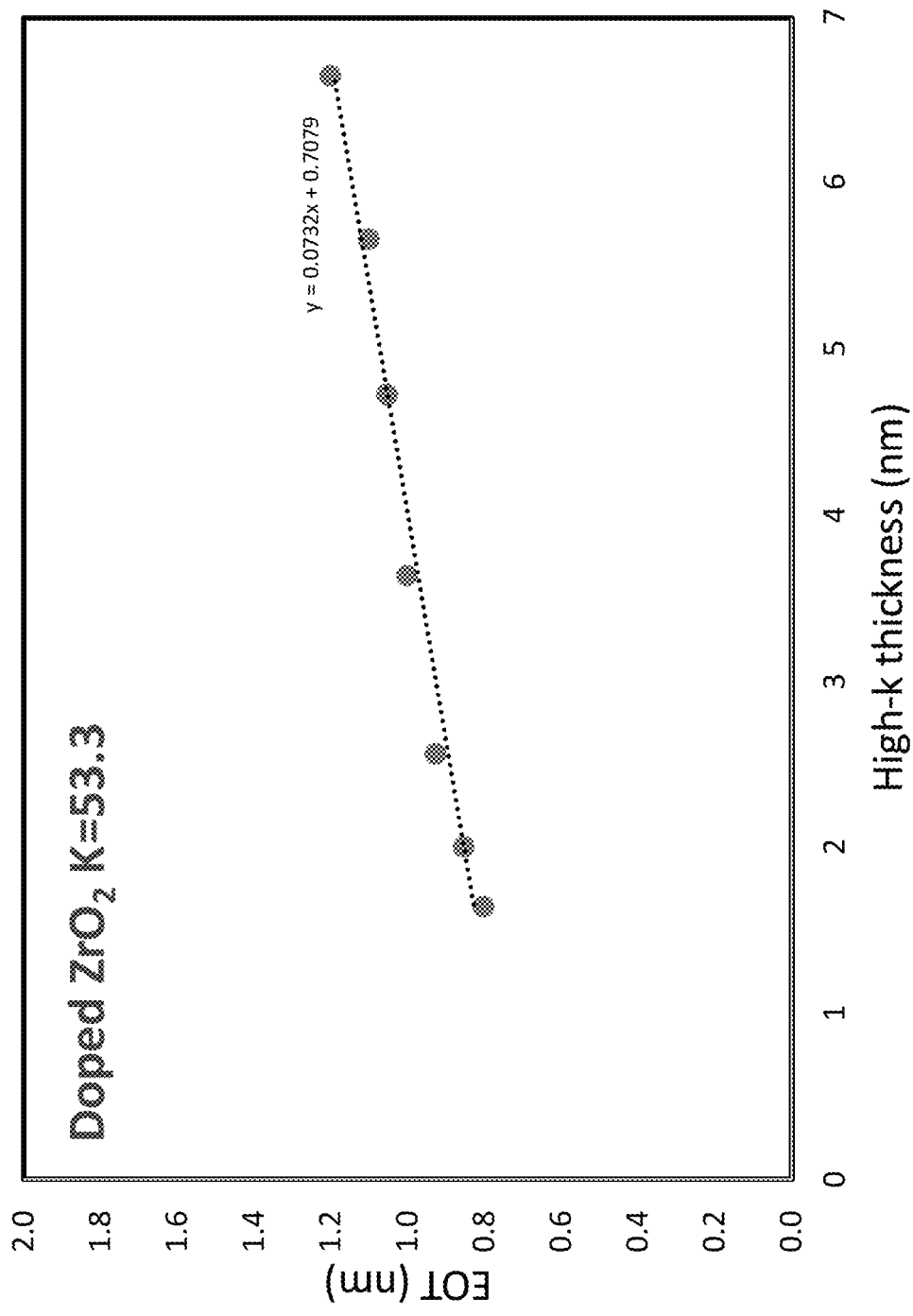
FIG. 11 represents a plot of the equivalent oxide thickness (EOT) as a function of $ZrO_2$ thickness according to an Example of the present disclosure.

Scaled 2 nm-7 nm Si doped $ZrO_2$ MIS capacitors were also studied. The samples were fabricated in accordance with the ALD process of the present disclosure. Equivalent oxide thickness (EOT) was calculated for each capacitor and was plotted in FIG. 11 and is shown as a function of $ZrO_2$ thickness. The slope of the EOT vs. high-k thickness plot was used to extract the k-value. The k-value was calculated to be 53, which is considered a high-k value.

Example 4: Si Doping Study to Suppress Gate Leakage in MIS Structure

Scaled 3 nm Si doped $ZrO_2$ and undoped $ZrO_2$ MIS capacitors were also studied. The Si doped sample was fabricated with the ALD process in accordance with the present disclosure, while the undoped sample was prepared using the ALD process without the silicon-containing precursor. Si pulses were varied from 0 to 4 pulses. A systematic decrease in leakage was seen with increasing Si doping. A 10× lower gate leakage was achieved at $V_g$=−1V by 4 Si dopant pulses in 3 nm $ZrO_2$. Lower gate leakage is key for front end logic. It was found that the leakage upper limit for low power operation is $2\times10^{-2}$ $A/cm^2$. The inventors have found that crystalline high-k oxides suffer from grain boundary gate leakage and therefore leakage suppression in scaled high-k crystalline gate oxides is essential for commercial use.

Figure 12:
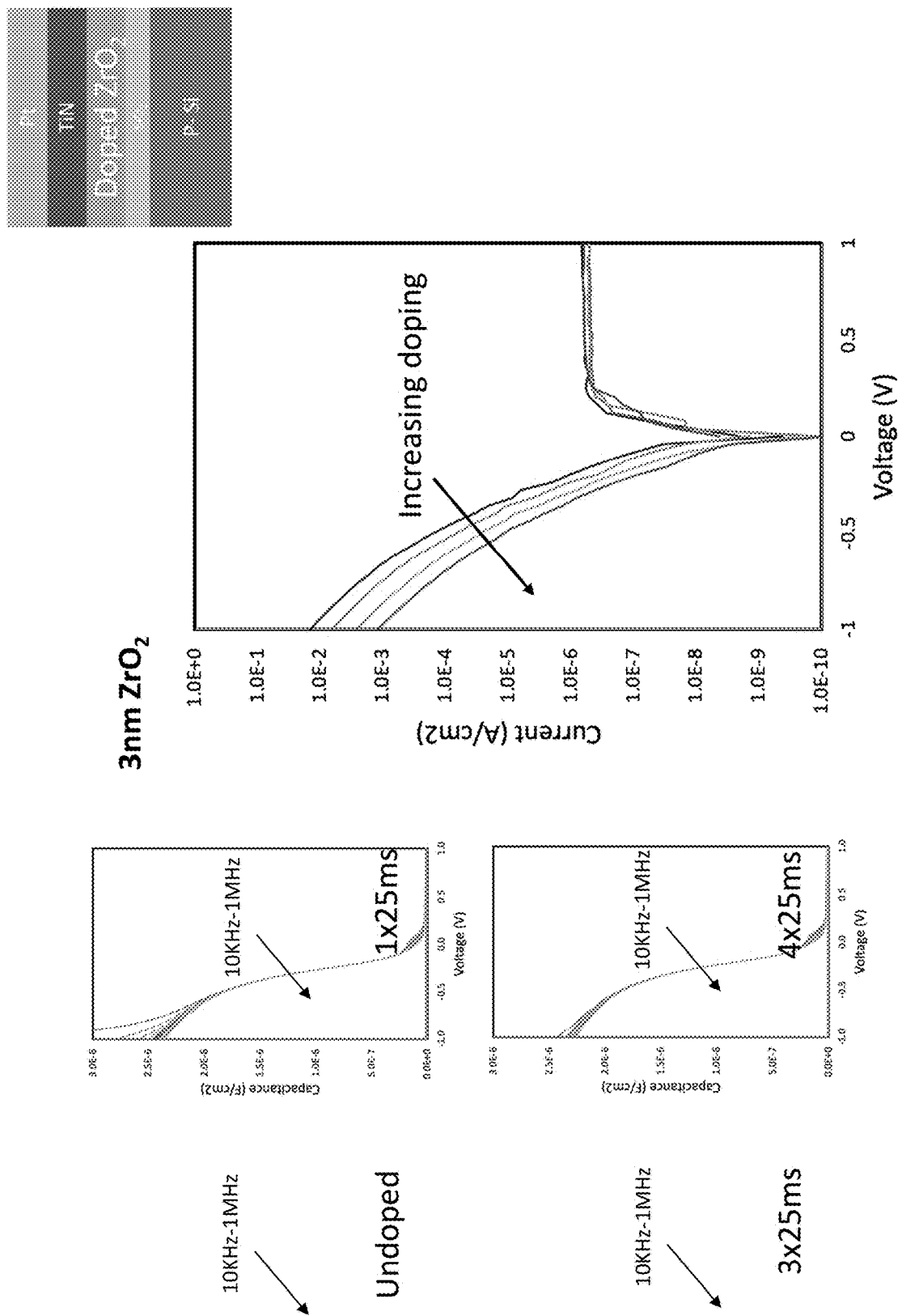
FIG. 12 represents various C-V measurement of samples in Example 4 of the present disclosure.

However, leakage suppression at the expense of k is not desirable. The Si doping in $ZrO_2/HfZrO_4$ of the present examples showed no reduction in k value as can be seen in the C-V measurement in FIG. 12. Additionally, FIG. 12 shows that no capacitance was decrease with a 10× lower leakage compared to undoped 3 nm $ZrO_2$, which had a change in k.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within #10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   performing an atomic layer deposition process to form a silicon doped hafnium zirconium oxide film on a surface of a substrate, wherein performing the atomic layer deposition process comprises:
   depositing at least one first layer comprising hafnium oxide by:
   exposing the surface of the substrate to hydrogen peroxide ($H_2O_2$); and
   exposing the surface of the substrate to a hafnium-containing precursor;
   depositing at least one second layer comprising zirconium oxide by:
   exposing the surface of the substrate to $H_2O_2$; and
   exposing the surface of the substrate to a zirconium-containing precursor; and
   depositing at least one third layer comprising silicon by:
   exposing the surface of the substrate to $H_2O_2$; and
   exposing the surface of the substrate to a silicon-containing precursor, and
   performing an annealing process to cause the at least one first layer, the at least one second layer, and the at least third layer to interdiffuse.

2. The method of claim 1, wherein the least one first layer and the at least one second layer combine to form a hafnium zirconium oxide film comprising about 40% to about 60% hafnium and about 40% to about 100% zirconium, and a remainder oxygen.

3. The method of claim 1, further comprising repeating the depositing of the at least one first layer comprising hafnium oxide a first plurality of times, the depositing of the at least one second layer comprising zirconium oxide a second plurality of times, and the depositing of the at least one third layer comprising silicon a third plurality of times until the silicon doped hafnium zirconium oxide film has a target thickness of less than about 5 nanometers.

4. The method of claim 1, wherein the hafnium-containing precursor comprises bis(cyclopentiadienyl)dimethylhafnium, bis(methylcyclopentadienyl)dimethylhafnium, bis(methylcyclopentadienyl)methoxymethylhafnium, hafnium (IV) t-butoxide, hafnium(IV) ethoxide, tetrakis(diethylamino)hafnium, tetrakis(ethylmethylamino)hafnium, tetrakis(dimethylamino)hafnium, tetrakis(2,2,6,6-tetramethyl-3,5-heptanedionato)hafnium(IV), $HfCl_4$, HfCp, or a combination thereof.

5. The method of claim 1, wherein the zirconium-containing precursor comprises tetrakis(ethylmethylamido)zirconium, tetrakis(dimethylamido)zirconium, tetrakis(diethylamido)zirconium, bis(cyclopentadienyl)dimethylzirconium, zirconium (IV) tert-butoxide, zirconium (IV) bromide, $ZrCl_4$, or a combination thereof.

6. The method of claim 1, wherein the hafnium-containing precursor comprises tetrakis(dimethylamino)hafnium and the zirconium-containing precursor comprises tetrakis(dimethylamino)zirconium.

7. The method of claim 1, wherein the silicon-containing precursor comprises silane, $SiCl_4$, tetrakis(dimethylamino)silicon, tris(dimethylamino)silane or a combination thereof.

8. The method of claim 1, wherein the substrate comprises a silicon substrate.

9. The method of claim 8, wherein the surface of the silicon substrate comprises a metal layer over which the silicon doped hafnium zirconium oxide film is formed.

10. The method of claim 9, wherein the metal layer comprises TiN.

11. The method of claim 1, wherein the silicon doped hafnium zirconium oxide film has a capacitance of at least about 15 mfd/cm$^2$.

12. A method comprising:
performing an atomic layer deposition process to form a silicon doped zirconium oxide film on a surface of a substrate, wherein performing the atomic layer deposition process comprises:
depositing at least one first layer comprising a zirconium oxide by:
exposing the surface of the substrate to $H_2O_2$; and
exposing the surface of the substrate to a zirconium-containing precursor; and
depositing at least one second layer comprising silicon by:
exposing the surface of the substrate to $H_2O_2$; and
exposing the surface of the substrate to a silicon-containing precursor, and
performing an annealing process to cause the at least one first layer, and the at least one second layer to interdiffuse.

13. The method of claim 12, wherein the zirconium-containing precursor comprises tetrakis(ethylmethylamido)zirconium, tris(dimethylamido)cyclopentadienylzirconium, bis(cyclopentadienyl)dimethylzirconium, bis(methylcyclopentadienyl)methoxymethylzirconium, $ZrCl_4$, or a combination thereof.

14. The method of claim 12, wherein the silicon-containing precursor comprises silane, $SiCl_4$, tetrakis(dimethylamino)silicon, tris(dimethylamino)silane or a combination thereof.

15. The method of claim 12, further comprising repeating the depositing of the at least one first layer comprising zirconium oxide a first plurality of times, and the depositing of the at least one second layer comprising silicon a second plurality of times until the silicon doped zirconium oxide film has a target thickness of less than about 5 nanometers.

16. The method of claim 12, wherein the substrate comprises a silicon substrate.

17. The method of claim 12, wherein the surface of the silicon substrate comprises a metal layer over which the silicon doped zirconium oxide film is formed.

* * * * *